US010979647B2

(12) United States Patent
Takado

(10) Patent No.: US 10,979,647 B2
(45) Date of Patent: Apr. 13, 2021

(54) IMAGING DEVICE AND IMAGING SYSTEM

(71) Applicant: CANON KABUSHIKI KAISHA, Tokyo (JP)

(72) Inventor: Hisashi Takado, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/598,574

(22) Filed: Oct. 10, 2019

(65) Prior Publication Data

US 2020/0137286 A1 Apr. 30, 2020

(30) Foreign Application Priority Data

Oct. 26, 2018 (JP) ............................ JP2018-201644

(51) Int. Cl.

| | |
|---|---|
| ***H04N 5/235*** | (2006.01) |
| ***H04N 5/355*** | (2011.01) |
| ***H04N 5/378*** | (2011.01) |
| ***G01S 17/89*** | (2020.01) |
| ***H01L 27/146*** | (2006.01) |
| ***G01S 17/08*** | (2006.01) |

(52) U.S. Cl.

CPC .......... *H04N 5/2353* (2013.01); *G01S 17/08* (2013.01); *G01S 17/89* (2013.01); *H01L 27/14607* (2013.01); *H01L 27/14621* (2013.01); *H01L 27/14643* (2013.01); *H04N 5/3559* (2013.01); *H04N 5/35581* (2013.01); *H04N 5/378* (2013.01)

(58) Field of Classification Search

CPC ............ H04N 5/2353; H04N 5/35581; H04N 5/3559; H04N 5/378; H04N 5/35563; H04N 5/35527; H04N 5/3535; G01S 17/08; G01S 17/89; H01L 27/14607; H01L 27/14621; H01L 27/14643

See application file for complete search history.

(56) References Cited

U.S. PATENT DOCUMENTS 7,643,075 B2 1/2010 Kurane
9,392,160 B2 * 7/2016 Sfaradi ............. H04N 5/35554
(Continued)

FOREIGN PATENT DOCUMENTS

JP 2002-101347 4/2002
JP 2002-190983 7/2002
(Continued)

*Primary Examiner* — Chiawei Chen
(74) *Attorney, Agent, or Firm* — Venable LLP

(57) ABSTRACT

An imaging device includes multiple pixels each having a photoelectric converter, a control unit that controls the pixels to output, from each pixel, a first signal based on charges generated by the photoelectric converter during first exposure time and a second signal based on charges generated by the photoelectric converter during second exposure time shorter than the first exposure time, a decision unit that decides whether or not a predetermined value is exceeded for each first signal output from the pixels and outputs a decision signal indicating a decision result, and a signal select unit that selects one of the first and second signals as an image forming signal of each pixel, and based on the decision signals of a target pixel and another pixel arranged in a predetermined region including the target pixel, the signal select unit selects the image forming signal of the target pixel.

15 Claims, 20 Drawing Sheets

(56) References Cited

U.S. PATENT DOCUMENTS

| | | | | |
|---|---|---|---|---|
| 9,900,532 | B2 | 2/2018 | Takado | |
| 9,900,535 | B2 | 2/2018 | Takado | |
| 9,912,886 | B2 | 3/2018 | Shigeta | |
| 9,961,278 | B2 * | 5/2018 | Ikeda | H04N 5/35581 |
| 10,044,992 | B2 | 8/2018 | Takado | |
| 10,122,951 | B2 | 11/2018 | Takado | |
| 10,244,192 | B2 | 3/2019 | Shigeta | |
| 10,477,165 | B2 | 11/2019 | Takado | |
| 2006/0170662 | A1 | 8/2006 | Kurane | |
| 2008/0211941 | A1 * | 9/2008 | Deever | H04N 5/2353 348/262 |
| 2009/0073293 | A1 * | 3/2009 | Yaffe | H04N 5/35581 348/297 |
| 2013/0021492 | A1 * | 1/2013 | Tatsuzawa | H04N 5/35581 348/222.1 |
| 2013/0242122 | A1 * | 9/2013 | Toyoda | H04N 5/2327 348/208.6 |
| 2015/0244916 | A1 * | 8/2015 | Kang | H04N 5/2355 348/222.1 |
| 2015/0348242 | A1 * | 12/2015 | Molgaard | G06T 5/002 348/241 |
| 2016/0330414 | A1 | 11/2016 | Takado | |
| 2018/0098012 | A1 | 4/2018 | Takado | |
| 2018/0352131 | A1 * | 12/2018 | Andorko | H04N 5/2354 |
| 2019/0199978 | A1 | 6/2019 | Takado | |

FOREIGN PATENT DOCUMENTS

| | | |
|---|---|---|
| JP | 2006-191536 | 7/2006 |
| JP | 2007-194687 | 8/2007 |

* cited by examiner

T1
T2
TIME
T40
T41
T42
T43
T44
T45
T46
ROW
1
2
3
4
m-3
m-2
m-1
m

FIG. 6A
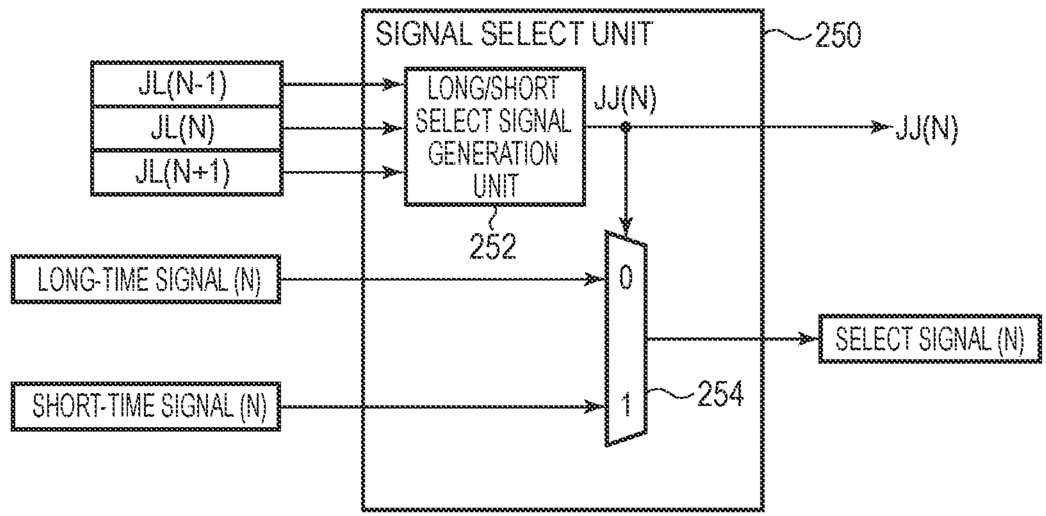
FIG. 6B
| JL(N-1) | JL(N) | JL(N+1) | JJ(N) |
|---|---|---|---|
| ϕ | 1 | ϕ | 1 |
| 0 | 0 | 0 | 0 |
| 1 | 0 | 1 | 1 |
| 1 | 0 | 0 | 1 |
| 0 | 0 | 1 | 1 |
FIG. 6C
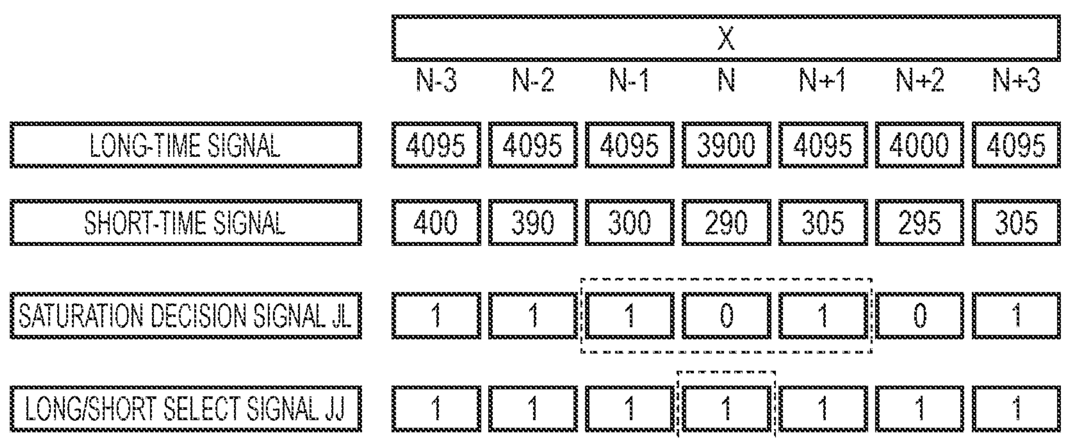

FIG. 9A

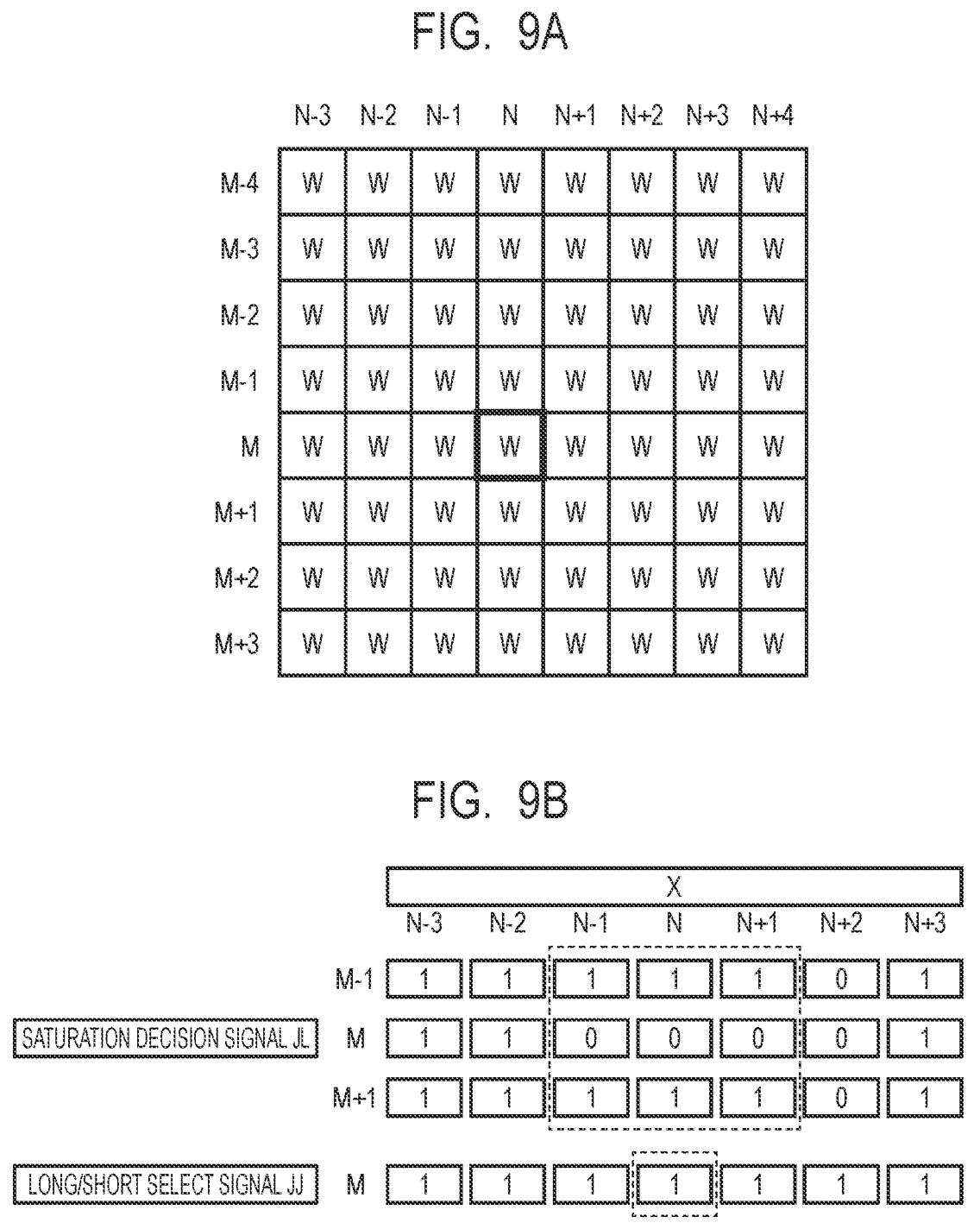

| | N-3 | N-2 | N-1 | N | N+1 | N+2 | N+3 | N+4 |
|---|---|---|---|---|---|---|---|---|
| M-4 | W | W | W | W | W | W | W | W |
| M-3 | W | W | W | W | W | W | W | W |
| M-2 | W | W | W | W | W | W | W | W |
| M-1 | W | W | W | W | W | W | W | W |
| M | W | W | W | W | W | W | W | W |
| M+1 | W | W | W | W | W | W | W | W |
| M+2 | W | W | W | W | W | W | W | W |
| M+3 | W | W | W | W | W | W | W | W |

FIG. 9B

| | | X | | | | | | |
|---|---|---|---|---|---|---|---|---|
| | | N-3 | N-2 | N-1 | N | N+1 | N+2 | N+3 |
| | M-1 | 1 | 1 | 1 | 1 | 1 | 0 | 1 |
| SATURATION DECISION SIGNAL JL | M | 1 | 1 | 0 | 0 | 0 | 0 | 1 |
| | M+1 | 1 | 1 | 1 | 1 | 1 | 0 | 1 |
| LONG/SHORT SELECT SIGNAL JJ | M | 1 | 1 | 1 | 1 | 1 | 1 | 1 |

FIG. 10A

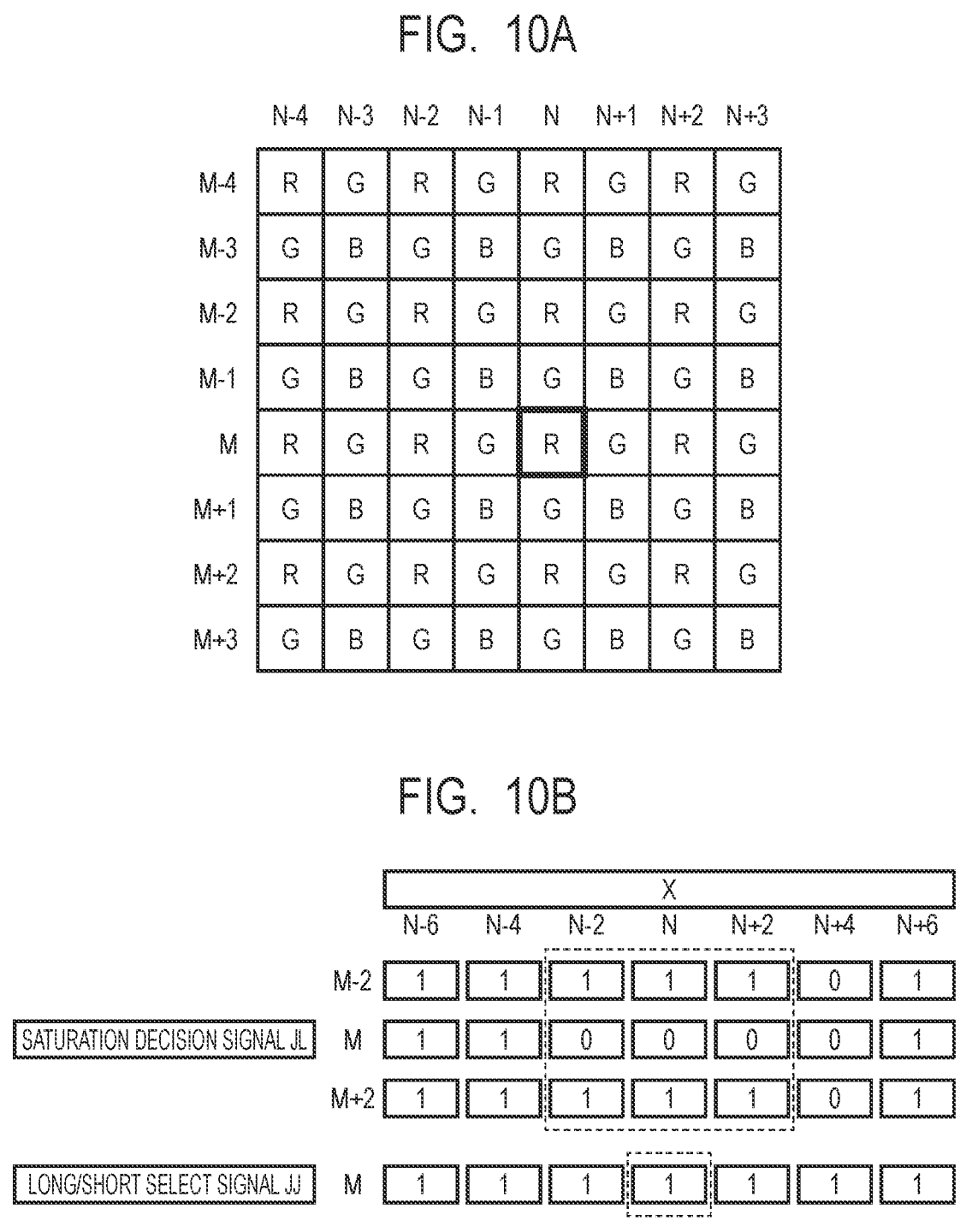

| | N-4 | N-3 | N-2 | N-1 | N | N+1 | N+2 | N+3 |
|---|---|---|---|---|---|---|---|---|
| M-4 | R | G | R | G | R | G | R | G |
| M-3 | G | B | G | B | G | B | G | B |
| M-2 | R | G | R | G | R | G | R | G |
| M-1 | G | B | G | B | G | B | G | B |
| M | R | G | R | G | R | G | R | G |
| M+1 | G | B | G | B | G | B | G | B |
| M+2 | R | G | R | G | R | G | R | G |
| M+3 | G | B | G | B | G | B | G | B |

FIG. 10B

| | | X | | | | | | |
|---|---|---|---|---|---|---|---|---|
| | | N-6 | N-4 | N-2 | N | N+2 | N+4 | N+6 |
| | M-2 | 1 | 1 | 1 | 1 | 1 | 0 | 1 |
| SATURATION DECISION SIGNAL JL | M | 1 | 1 | 0 | 0 | 0 | 0 | 1 |
| | M+2 | 1 | 1 | 1 | 1 | 1 | 0 | 1 |
| LONG/SHORT SELECT SIGNAL JJ | M | 1 | 1 | 1 | 1 | 1 | 1 | 1 |

20
VERTICAL SCANNING CIRCUIT
14
12
10
16
Vvl
AMPLIFIER
33
Vamp
LONG-TIME SIGNAL SATURATION DECISION UNIT
38
36
REFERENCE SIGNAL GENERATION CIRCUIT
Vr
COMPARATOR
35
Vcmp
COUNTER
46
42
JL-MEMORY
44-1
N-MEMORY
44-2
S-MEMORY
44-3
N-MEMORY
44-4
S-MEMORY
44-5
60
SIGNAL PROCESSING UNIT
D
50
HORIZONTAL SCANNING CIRCUIT n-TH FRAME
(n+1)-TH FRAME
T1
T2
ACCUMULATION PERIOD OF POTODIODE PD
PD1(n)
PD2(n)
PD1(n+1)
ACCUMULATION PERIOD OF CHARGE HOLDING PORTION MEM1
MEM1(n-1)
MEM1(n)
ACCUMULATION PERIOD OF CHARGE HOLDING PORTION MEM2
MEM2(n-1)
MEM2(n)
ROW
1
2
3
4
m-1
m
TIME
T40
T41
T42
T43
T44
T45

200
SIGNAL PROCESSING UNIT
250
SIGNAL SELECT UNIT
LONG/SHORT SELECT SIGNAL GENERATION UNIT
252
JJ(N)
0
1
254
260
HDR COMPOSITION UNIT
S-SIGNAL
N-SIGNAL
HDR COMPOSITION UNIT
HDR COMPRESSION DATA
44-1
JL-MEMORY(N-1)
JL-MEMORY(N)
JL-MEMORY(N+1)
44-2
N-MEMORY
S-MEMORY
44-3
44-4
N-MEMORY
S-MEMORY
44-5
LONG-TIME SIGNAL
SHORT-TIME SIGNAL

VERTICAL SCANNING CIRCUIT
REFERENCE SIGNAL GENERATION CIRCUIT
COUNTER
AMPLIFIER
LONG-TIME SIGNAL SATURATION DECISION UNIT
COMPARATOR
JL-MEMORY
SIGNAL SELECT UNIT
JJ-MEMORY
N-MEMORY
S-MEMORY
HORIZONTAL SCANNING CIRCUIT
SIGNAL PROCESSING UNIT
Vvl
Vamp
Vr
Vcmp
D
10
12
16
20
33
35
36
38
42
44-1
44-2
44-3
44-6
46
48
50
60

400
412
EXTERNAL I/F UNIT
COMPUTER
416
STORAGE MEDIUM CONTROL I/F UNIT
414
STORAGE MEDIUM
410
MEMORY UNIT
408
SIGNAL PROCESSING UNIT
418
GENERAL CONTROL/OPERATION UNIT
420
TIMING GENERATION UNIT
401
IMAGING DEVICE
404
APERTURE
402
LENS
406

IMAGING DEVICE AND IMAGING SYSTEM

BACKGROUND OF THE INVENTION

Field of the Invention

The present invention relates to an imaging device and an imaging system.

Description of the Related Art

In an imaging device used for an on-vehicle camera, a surveillance camera, or the like, a scheme to generate an image having a wide dynamic range by composing an image obtained by a relatively long exposure time (a long-time image) and an image obtained by a relatively short exposure time (a short-time image) is used in general. Japanese Patent Application Laid-Open No. 2006-191536 discloses a method that, when a long-time image and a short-time image are composed, a composition process is performed by referencing a saturation flag indicating whether or not a signal of the long-time image is saturated and, when the signal of the long-time image is saturated, using a signal of the short-time image instead of the signal of the long-time image.

In the scheme disclosed in Japanese Patent Application Laid-Open No. 2006-191536, however, image quality of an image obtained by composing a long-time image and a short-time image may deteriorate due to an offset occurring at a joining part of the long-time image and the short-time image.

SUMMARY OF THE INVENTION

The present invention intends to provide an imaging device and an imaging system that may acquire a high quality, high dynamic range image.

According to one aspect of the present invention, provided is an imaging device including a plurality of pixels arranged over a plurality of rows and a plurality of columns and each having a photoelectric converter, a control unit that controls the plurality of pixels so as to output, from each of the plurality of pixels, a first signal based on charges generated by the photoelectric converter during a first exposure time and a second signal based on charges generated by the photoelectric converter during a second exposure time that is shorter than the first exposure time, a decision unit that performs a decision process to decide whether or not a predetermined value is exceeded for the first signal output from each of the plurality of pixels and outputs a decision signal indicating a decision result, and a signal select unit that selects one of the first signal and the second signal as an image forming signal of each of the plurality of pixels, wherein based on the decision signal of a target pixel and the decision signal of another pixel arranged in a predetermined region including the target pixel, the signal select unit selects the image forming signal of the target pixel.

Further, according to another aspect of the present invention, provided is a signal processing device configured to process a signal output from an imaging element that includes a plurality of pixels each having a photoelectric converter and outputs, from each of the plurality of pixels, a first signal based on charges generated by the photoelectric converter during a first exposure time and a second signal based on charges generated by the photoelectric converter during a second exposure time that is shorter than the first exposure time. The signal processing device includes a decision unit that decides whether or not a predetermined value is exceeded for the first signal output from each of the plurality of pixels and outputs a decision signal indicating a decision result, and a signal select unit that selects one of the first signal and the second signal as an image forming signal of each of the plurality of pixels, wherein based on the decision signal of a target pixel and the decision signal of another pixel arranged in a predetermined region including the target pixel, the signal select unit selects the image forming signal of the target pixel.

Further, according to yet another aspect of the present invention, provided is an imaging system including an imaging device including an imaging element that includes a plurality of pixels each having a photoelectric converter and outputs, from each of the plurality of pixels, a first signal based on charges generated by the photoelectric converter during a first exposure time and a second signal based on charges generated by the photoelectric converter during a second exposure time that is shorter than the first exposure time, and a signal processing unit that processes a signal output from the imaging device. The signal processing unit includes a decision unit that decides whether or not a predetermined value is exceeded for the first signal output from each of the plurality of pixels and outputs a decision signal indicating a decision result, and a signal select unit that selects one of the first signal and the second signal as an image forming signal of each of the plurality of pixels, wherein based on the decision signal of a target pixel and the decision signal of another pixel arranged in a predetermined region including the target pixel, the signal select unit selects the image forming signal of the target pixel.

Further features of the present invention will become apparent from the following description of exemplary embodiments with reference to the attached drawings.

BRIEF DESCRIPTION OF THE DRAWINGS

FIG. 6A is a diagram illustrating a configuration of a signal select unit in the imaging device according to the first embodiment of the present invention.

FIG. 6B and FIG. 6C are diagrams illustrating operations of the signal select unit in the imaging device according to the first embodiment of the present invention.

FIG. 9A, FIG. 9B, FIG. 10A, and FIG. 10B are diagrams illustrating generation methods of long/short select signal in an imaging device according to a second embodiment of the present invention.

DESCRIPTION OF THE EMBODIMENTS

First Embodiment

Figure 1:
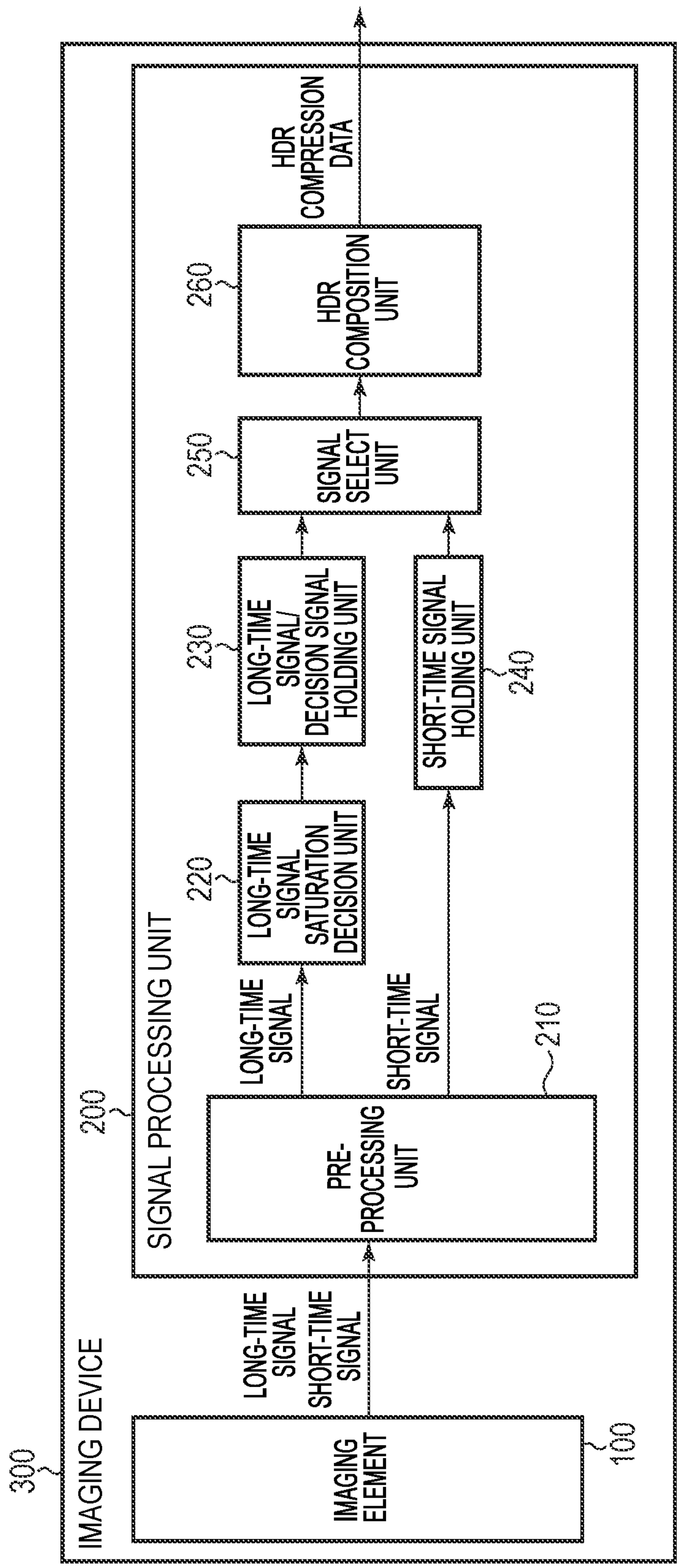
FIG. 1 is a block diagram illustrating a general configuration of an imaging device according to a first embodiment of the present invention.
Figure 2:
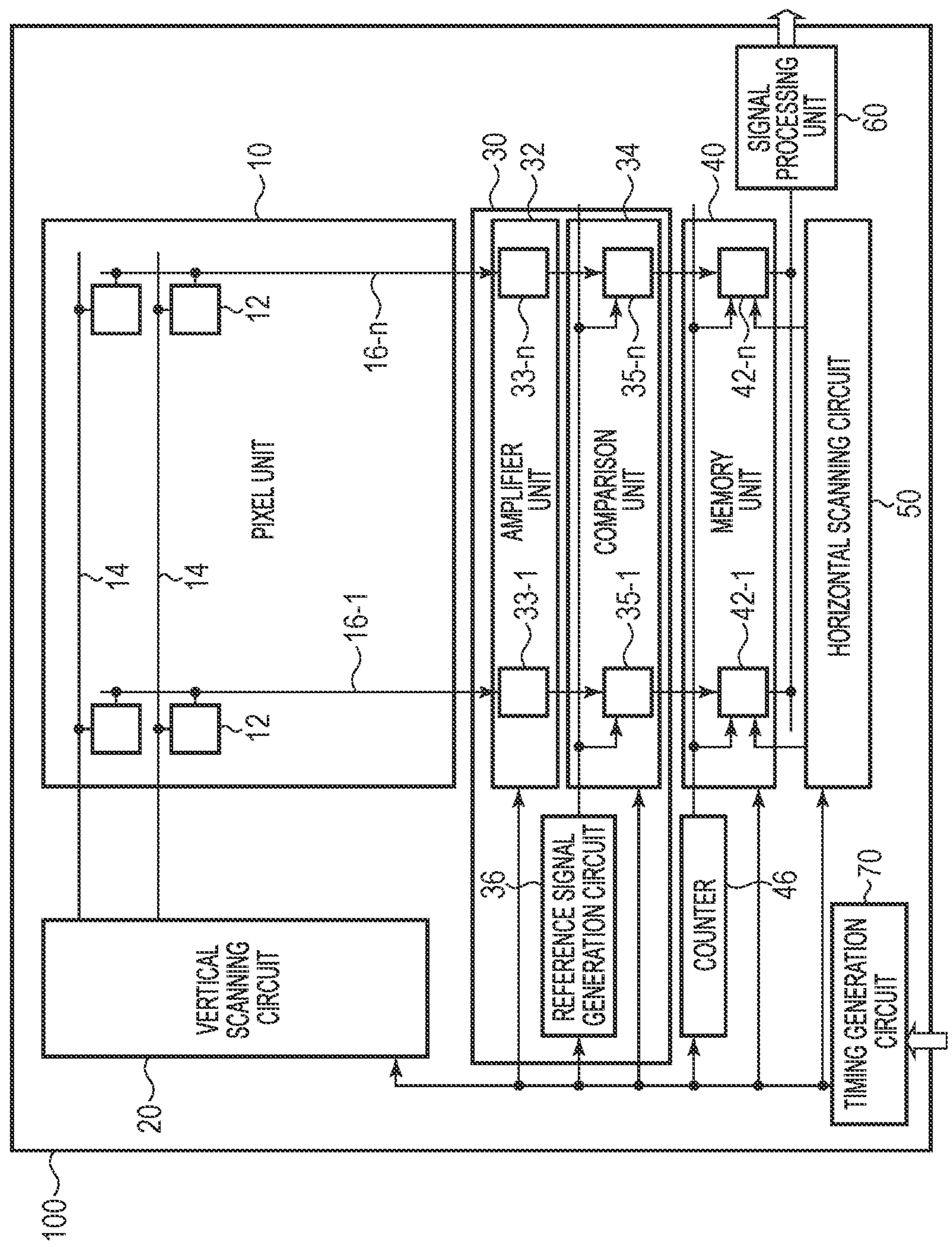
FIG. 2 is a block diagram illustrating a general configuration of an imaging element in the imaging device according to the first embodiment of the present invention.
Figure 3:
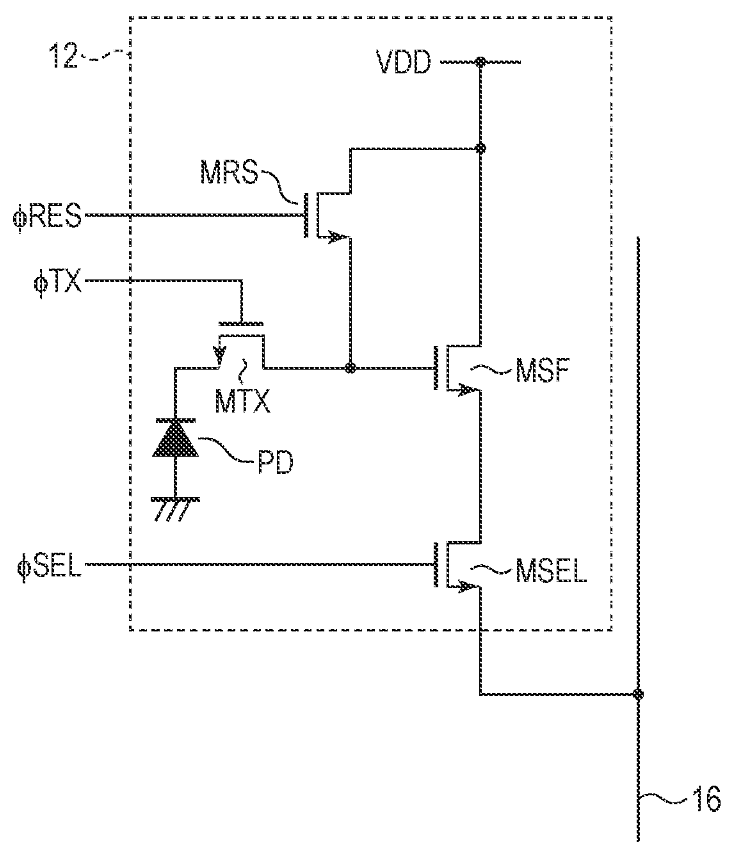
FIG. 3 is a circuit diagram illustrating a configuration example of pixels of the imaging element in the imaging device according to the first embodiment of the present invention.

The configuration of an imaging device according to a first embodiment of the present invention will be described with reference to FIG. 1 to FIG. 3. FIG. 1 is a block diagram illustrating a general configuration of the imaging device according to the present embodiment. FIG. 2 is a block diagram illustrating a general configuration of an imaging element in the imaging device according to the present embodiment. FIG. 3 is a circuit diagram illustrating a configuration example of pixels of the imaging element in the imaging device according to the present embodiment.

As illustrated in FIG. 1, an imaging device 300 according to the present embodiment includes an imaging element 100 and a signal processing unit 200.

The imaging element 100 converts an incident light signal (an object image) received via an optical system (not illustrated) into an electric signal and outputs the electric signal. The imaging element 100 may be formed of a so-called single-plate color sensor in which color filters (hereafter, also referred to as "CF") are arranged on a CMOS image sensor or a CCD image sensor, for example. The imaging element 100 is not necessarily required to be a color sensor and may be a monochrome sensor.

The imaging element 100 outputs a signal based on charges generated during a first exposure time and a signal based on charges generated during a second exposure time. The first exposure time is relatively longer than the second exposure time. The second exposure time is relatively shorter than the first exposure time. In the description below, the signal based on charges generated during the first exposure time may be referred to as "long-time signal", and the signal based on charges generated during the second exposure time may be referred to as "short-time signal". The long-time signal and the short-time signal are signals used for obtaining an image signal having a wide dynamic range.

The signal processing unit 200 includes a pre-processing unit 210, a long-time signal saturation decision unit 220, a long-time signal/decision signal holding unit 230, a short-time signal holding unit 240, a signal select unit 250, and an HDR composition unit 260.

The pre-processing unit 210 performs a pre-process of signal processing on an output signal from the imaging element 100. When the output signal from the imaging element 100 is an analog signal, an analog-to-digital (A/D) conversion process on the output signal from the imaging element 100 may be performed in the pre-processing unit 210. In the present embodiment, 12-bit A/D conversion is performed on the output signal from the imaging element 100. The pre-processing unit 210 suitably performs correction (pre-processing) such as offset (OFFSET) correction, gain (GAIN) correction, or the like on the output signal (input signal Din) of the imaging element 100 and generates the corrected output signal (data Dout). This process is typically expressed by Equation (1) below.

$$Dout=(Din-\mathrm{OFFSET})\times\mathrm{GAIN} \tag{1}$$

Correction in the pre-processing unit 210 can be performed in various units. For example, a case where correction is performed on a pixel 12 basis, a case where correction is performed on a column amplifier basis, a case where correction is performed on an analog-to-digital conversion (ADC) unit basis, a case where correction is performed on an output amplifier basis, or the like may be considered. By performing correction of the output signal from the imaging element 100, it is possible to reduce so-called fixed pattern noise and obtain a higher quality image.

The pre-processing unit 210 performs pre-processing on each of a long-time signal and a short-time signal output from the imaging element 100, separates the processed long-time signal and the processed short-time signal from each other, and transmits the separated signals to a post-processing unit. Specifically, the pre-processing unit 210 transmits the processed long-time signal to the long-time signal saturation decision unit 220 and transmits the processed short-time signal to the short-time signal holding unit 240.

The long-time signal saturation decision unit 220 performs a decision process to decide whether or not the long-time signal is saturated and transmits a saturation decision signal indicating a decision result together with the long-time signal to the post-processing unit.

The long-time signal/decision signal holding unit 230 holds a long-time signal and a saturation decision signal transmitted from the long-time signal saturation decision unit 220. Further, the short-time signal holding unit 240 holds a short-time signal transmitted from the pre-processing unit 210. A timing when a long-time signal is transmitted from a pixel 12 is different from a timing when a short-time signal is transmitted from the same pixel 12. The long-time signal/decision signal holding unit 230 is a memory that temporarily holds a long-time signal and a decision signal in order to output a long-time signal from a pixel and a short-time signal from the same pixel to the post-processing unit at the same time. Similarly, a short-time signal holding unit 240 is a memory that temporarily holds a short-time signal in order to output a long-time signal from a pixel and a short-time signal from the same pixel to the post-processing unit at the same time. The long-time signal/decision signal holding unit 230 and the short-time signal holding unit 240 include line memories formed of SRAM for 10 rows, for example.

The signal select unit 250 selects one of the long-time signal transmitted from the long-time signal saturation decision unit 220 and the short-time signal transmitted from the short-time signal holding unit 240 based on the saturation decision signal held in the long-time signal/decision signal holding unit 230 and outputs the selected signal to the HDR composition unit 260. The selected signal is used as a signal for image forming in the pixel.

The HDR composition unit 260 performs a high dynamic range process to compose a high dynamic range image by using a select flag transmitted from the signal select unit 250 and the selected signal and outputs HDR compression data.

As illustrated in FIG. 2, the imaging element 100 includes a pixel unit 10, a vertical scanning circuit 20, a readout circuit unit 30, a memory unit 40, a counter 46, a horizontal scanning circuit 50, a signal processing unit 60, and a timing generation circuit 70.

In the pixel unit 10, the plurality of pixels 12 are arranged in a matrix over a plurality of rows and a plurality of columns. In the pixel unit 10, for example, 1920 pixels in the column direction by 1080 pixels in the row direction, namely, 2073600 pixels in total are arranged. The number of pixels arranged in the pixel unit 10 is not limited, and a larger number of pixels or a smaller number of pixels may be arranged.

On each row of the pixel unit 10, a control line 14 is arranged extending in a first direction (the horizontal direction in FIG. 2). The control line 14 is connected to the pixel 12 aligned in the first direction, respectively, to form a signal line common to these pixels 12. The first direction in which the control line 14 extends may be referred to as a row direction or a horizontal direction.

On each column of the pixel unit 10, a vertical signal line 16 is arranged extending in a second direction intersecting the first direction (the vertical direction in FIG. 2). The vertical signal line 16 is connected to the pixels 12 aligned in the second direction, respectively, to form a signal line common to these pixels 12. The second direction in which the vertical signal line 16 extends may be referred to as a column direction or a vertical direction.

In FIG. 2, a case where the pixel unit 10 includes the pixels 12 on n columns from the first column to the n-th column is considered, and a column number is attached to the reference of the vertical signal line 16 on each column. For example, the vertical signal line 16 on the first column is labeled with a reference "16-1", and the vertical signal line 16 on the n-th column is labeled with a reference "**16-*n*". In the description below, the same notation is used for elements provided in association with columns of the pixel unit 10**.

The control line 14 on each row is connected to the vertical scanning circuit 20. The vertical scanning circuit 20 is a control unit that supplies, to the pixel 12 via the control line 14, a control signal used for driving a readout circuit in the pixel 12 on a row basis when the pixel signal is read out. Pixel signals of the pixel 12 belonging to a row selected by a control signal supplied from the vertical scanning circuit 20 (selected row) are output to the vertical signal lines 16 on columns corresponding to these pixels 12 at the same time.

The vertical signal line 16 on each column is connected to the readout circuit unit 30. The readout circuit unit 30 includes an amplifier unit 32, a comparison unit 34, and a reference signal generation circuit 36. The amplifier unit 32 includes n amplifiers 33-1 to **33-*n* provided in association with respective columns of the pixel unit 10. The amplifiers 33-1 to 33-*n* amplify pixel signals output from the pixels 12 via the vertical output lines 16-1 to 16-*n* corresponding to respective columns. The comparison unit 34 includes n comparators 35-1 to 35-*n* provided in association with respective columns of the pixel unit 10. The comparators 35-1 to 35-*n* compare the levels of pixel signals output from the amplifiers 33-1 to 33-*n* corresponding to respective columns with the level of a reference signal output from the reference signal generation circuit 36** and outputs a comparison result.

The memory unit 40 includes n memories 42-1 to **42-*n* provided in association with respective columns of the pixel unit 10. The memories 42-1 to 42-*n* receive signals output from the comparators 35-1 to 35-*n* on columns corresponding to respective memories and latch and hold a count signal output from the counter 46 in response to the received signal. The reference signal output from the reference signal generation circuit 36 is a signal whose signal level changes with time at a constant rate. The count signals held in the memories 42-1 to 42-*n* correspond to digital pixel signals obtained by performing analog-to-digital (AD) conversion on analog pixel signals output from the pixel 12**.

The horizontal scanning circuit 50 is a control unit that supplies, to the memory unit 40, a control signal used for sequentially selecting the memories 42-1 to **42-*n* on respective columns of the memory unit 40. The memories 42-1 to 42-*n* that have received control signals from the horizontal scanning circuit 50 transfer the held digital pixel signals to the signal processing unit 60. The signal processing unit 60 performs predetermined digital signal processing on the digital pixel signal of each column transferred from the memory unit 40 and outputs the processed signal to the outside of the imaging element 100**.

The timing generation circuit 70 is a circuit unit for supplying, to the vertical scanning circuit 20, the readout circuit unit 30, the memory unit 40, the horizontal scanning circuit 50, and the like, control signals that control the operations or timings thereof. Some or all of the control signals supplied to the vertical scanning circuit 20, the readout circuit unit 30, memory unit 40, the horizontal scanning circuit 50, and the like may be supplied from the outside of the imaging element 100.

As illustrated in FIG. 3, each of the pixels 12 includes a photodiode PD, a transfer transistor MTX, a reset transistor MRS, an amplifier transistor MSF, and a select transistor MSEL. The photodiode PD has the anode connected to a reference voltage node and the cathode connected to the source of the transfer transistor MTX. The drain of the transfer transistor MTX is connected to the source of the reset transistor MRS and the gate of the amplifier transistor MSF. The connection node of the drain of the transfer transistor MTX, the source of the reset transistor MRS, and the gate of the amplifier transistor MSF is a so-called floating diffusion FD. The floating diffusion FD includes a capacitance component, functions as a charge holding portion, and forms a charge-to-voltage conversion unit formed of the capacitance component. The drain of the reset transistor MRS and the drain of the amplifier transistor MSF are connected to a power supply voltage node (voltage VDD). The source of the amplifier transistor MSF is connected to the drain of the select transistor MSEL. The source of the select transistor MSEL that is also the output node of the pixel 12 is connected to the vertical signal line 16.

The photodiode PD is a photoelectric converter that generates charges corresponding to the light amount of an incident light. When an optical image of an object enters the pixel unit 10, the photodiode PD of each pixel 12 converts (photoelectrically converts) the incident light into an amount of charges in accordance with the light amount and accumulates the generated charges. When turned on, the transfer transistor MTX transfers charges held by the photodiode PD to the floating diffusion FD. The floating diffusion FD has a voltage corresponding to the amount of charges transferred from the photodiode PD by charge-to-voltage conversion caused by the capacitance component. The amplifier transistor MSF is configured such that the voltage VDD is supplied to the drain and a bias current is supplied to the source from a current source (not illustrated) via the select transistor MSEL, and forms an amplifier unit (source follower circuit) whose gate is the input node. Thus, the amplifier transistor MSF outputs a signal based on the voltage of the floating diffusion FD to the vertical signal line 16 via the select transistor MSEL. When turned on, the reset transistor MRS resets the floating diffusion FD to a voltage corresponding to the voltage VDD.

In the case of the pixel 12 of the circuit configuration as illustrated FIG. 3, the control line 14 on each row includes a signal line connected to the gate of the transfer transistor MTX, a signal line connected to the gate of the reset transistor MRS, and a signal line connected to the gate of the select transistor MSEL. A control signal ϕTX is supplied from the vertical scanning circuit 20 to the transfer transistor MTX via the control line 14. A control signal ϕRES is supplied from the vertical scanning circuit 20 to the reset transistor MRS via the control line 14. A control signal ϕSEL is supplied from the vertical scanning circuit 20 to the select transistor MSEL via the control line 14. A plurality of pixels 12 in the pixel unit 10 are controlled by the control signals ϕTX, ϕRES, and ϕSEL supplied from the vertical scanning circuit 20 on a row basis. When each transistor of the pixel 12 is formed of an n-channel transistor, the corresponding transistor is in an on-state when the above control signal is at a High level (H level), and the corresponding transistor is in an off-state when the above control signal is at a Low level (L level).

Figure 4:
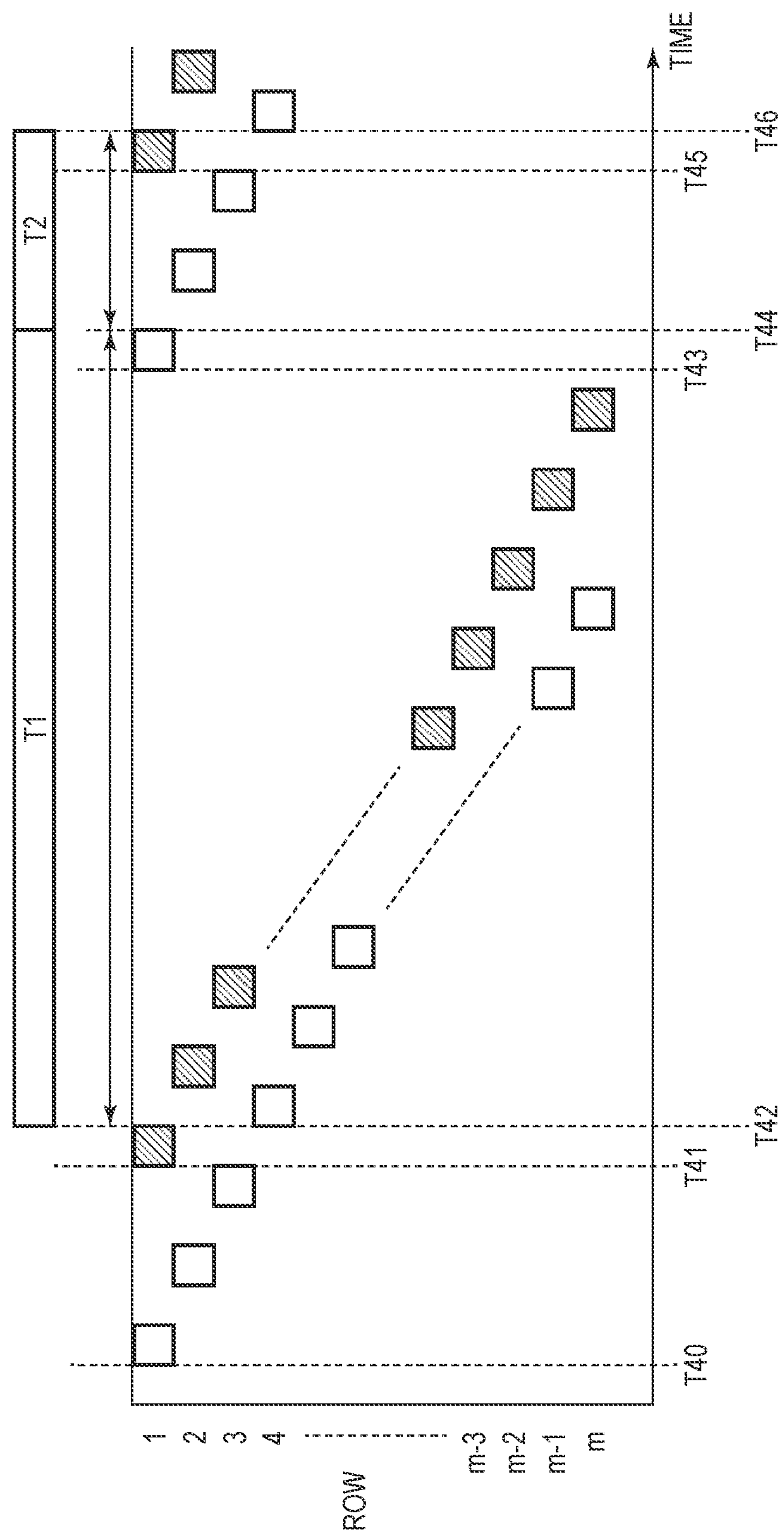
FIG. 4 is a timing diagram illustrating a readout operation of the imaging element in the imaging device according to the first embodiment of the present invention.

Next, the operation timing of the imaging element 100 will be described by using FIG. 4. FIG. 4 is a timing diagram illustrating a readout operation of the imaging element in the imaging device according to the present embodiment.

As illustrated in FIG. 4, the imaging element 100 performs line interleave drive to perform a readout operation of a long-time signal and a readout operation of a short-time signal in an alternating manner on a row basis during one frame.

A readout operation of a signal in a particular frame is started from time T40, for example. Time T40 is the time when a readout operation of a long-time signal of the pixel 12 on the first row in the frame is started. Readout operations of the long-time signal of the pixel 12 of the second and subsequent rows are performed sequentially on a row basis at a predetermined interval.

A readout operation of a short-time signal of the pixel 12 on the first row is started, for example, from time T41 after the end of the readout operation of the long-time signal of the pixel 12 on the third row. A readout operation of a long-time signal of the pixel 12 on the fourth row is started from time T42 after the end of the readout operation of the short-time signal of the pixel 12 on the first row.

In such a way, on and after time T41, the readout operations of the long-time signal and the short-time signal are performed in an alternating manner on a row basis in the order of readout of the short-time signal of the pixels 12 on the first row, readout of the long-time signal of the pixel 12 on the fourth row, readout of the short-time signal on the second row, and readout of the long-time signal on the fifth row. Upon the completion of the readout operation of the short-time signal of the pixel 12 on the m-th row, which is the last row, the readout operation of the frame is completed.

At time T43 after the end of the readout operation of the short-time signal of the pixel 12 on the m-th row, a readout operation of the next frame is started. The operation on and after time T43 is the same as the readout operation in the previous frame, that is, in the period from time T40 to T43. The period from time T43 to T44 is a period in which a readout operation of the long-time signal of the pixel 12 on the first row is performed. The length of the period from time T42 to T44 is the exposure time (accumulation time) T1 for generating signal charges as a long-time signal in the pixel 12 on the first row. The period from time T45 to T46 is a period in which a readout operation of a short-time signal of the pixel 12 on the first row is performed. The length of the period from time T44 to T46 is the exposure time (accumulation time) T2 for generating signal charges as a short-time signal in the pixel 12 on the first row.

In such a way, the long-time signal and the short-time signal read out from the imaging element 100 are input to the pre-processing unit 210 of the signal processing unit 200. The pre-processing unit 210 performs predetermined pre-processing for each of the long-time signal and the short-time signal, then transmits the processed long-time signal to the long-time signal saturation decision unit 220, and transmits the processed short-time signal to the short-time signal holding unit 240.

Figure 5:
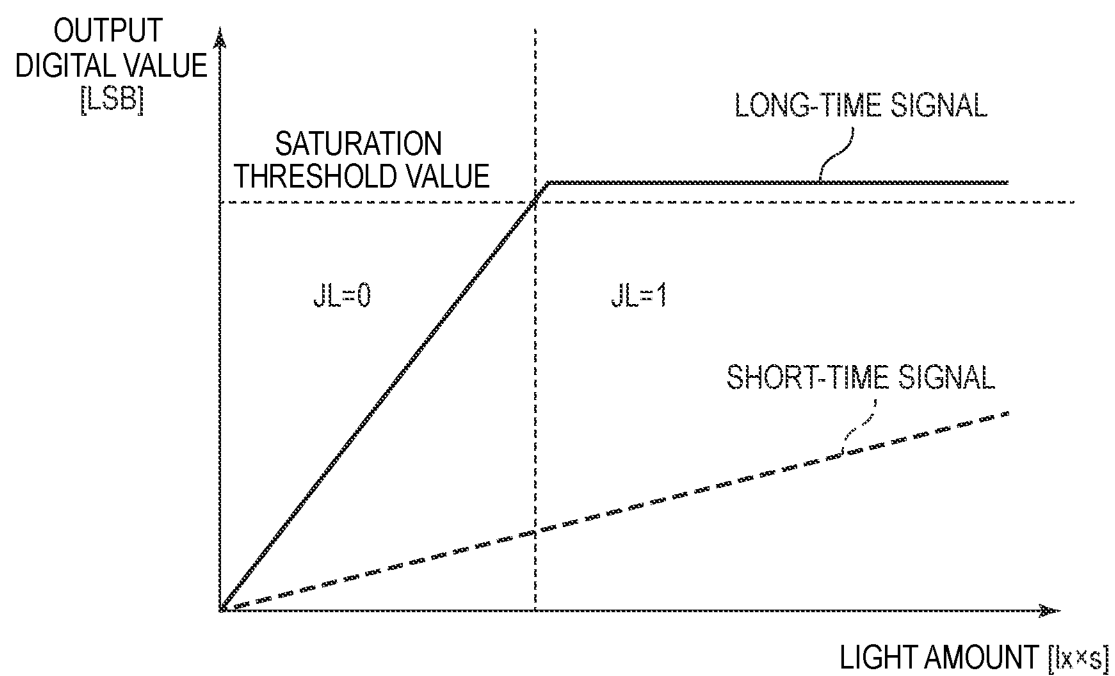
FIG. 5 is a diagram illustrating an operation of a long-time signal saturation decision unit in the imaging device according to the first embodiment of the present invention.

Next, the operation of the long-time signal saturation decision unit 220 will be described by using FIG. 5. FIG. 5 is a diagram illustrating the operation of the long-time signal saturation decision unit 220 in the imaging device according to the present embodiment.

As illustrated in FIG. 5, the signal level of the long-time signal and the short-time signal increases as the amount of incident light on the pixel 12 increases. When the amount of signal charges generated in the photodiode PD exceeds the upper limit of the charge amount that can be accumulated in the photodiode PD (saturation charge amount), the signal level is saturated. A long-time signal whose accumulation time of signal charges is relatively longer than a short-time signal has a larger signal level than the short-time signal at the same light amount and thus is saturated at less light amount than the short-time signal.

In the long-time signal saturation decision unit 220, a saturation threshold value that is a reference for deciding whether or not the output signal is saturated is set in advance. As illustrated in FIG. 5, for example, the saturation threshold value may be set to a signal level slightly lower than the output signal level corresponding to the saturation charge amount of the photodiode PD.

The long-time signal saturation decision unit 220 compares data of a long-time signal received from the pre-processing unit 210 with a preset saturation threshold value. As a result, when a data value of a long-time signal exceeds the saturation threshold value, a saturation decision signal JL is set to 1, and when a data value of a long-time signal is less than or equal to the threshold value, the saturation decision signal JL is set to 0. The long-time signal saturation decision unit 220 then transmits a long-time signal and the saturation decision signal JL indicating the decision result to the long-time signal/decision signal holding unit 230. The long-time signal/decision signal holding unit 230 holds a long-time signal and a saturation decision signal received from the long-time signal saturation decision unit 220.

Next, the operation of the signal select unit 250 will be described by using FIG. 6A to FIG. 6C. FIG. 6A is a diagram illustrating a configuration example of the signal select unit 250 in the imaging device according to the present embodiment. FIG. 6B and FIG. 6C are diagrams illustrating the operation of the signal select unit 250 in the imaging device according to the present embodiment.

As illustrated in FIG. 6A, the signal select unit 250 includes a long/short select signal generation unit 252 and a selector 254. The long/short select signal generation unit 252 holds the saturation decision signal JL received from the long-time signal/decision signal holding unit 230 for a plurality of pixels. In the case of a monochrome sensor, the long/short select signal generation unit 252 holds the saturation decision signal JL corresponding to the pixels 12 in a predetermined region including a plurality of columns adjacent to each other. For example, the long/short select signal generation unit 252 holds a saturation decision signal JL (N−1) corresponding to the pixel 12 on the (N−1)-th column, a saturation decision signal JL (N) corresponding to the pixel 12 on the N-th column, and a saturation decision signal JL (N+1) corresponding to the pixel 12 on the (N+1)-th column. Then, the long/short select signal generation unit 252 generates a long/short select signal JJ (N) corresponding to the pixel 12 on the N-th column based on the saturation decision signals JL (N−1), JL (N), and JL (N+1) and transmits the long/short select signals to the selector 254.

FIG. 6B is an example of a truth table illustrating the relationship between the saturation decision signals JL (N−1), JL (N), and JL (N+1) as input signals and the long/short select signal JJ (N) as an output signal. In the truth table, ϕ denotes “don’t care”.

The long/short select signal generation unit 252 outputs 1 as a long/short select signal JJ (N) unconditionally if the saturation decision signal JL (N) is 1. Even if the saturation decision signal JL (N) is 0, if one of the saturation decision signal JL (N−1) and the saturation decision signal JL (N+1) is 1, the long/short select signal generation unit 252 outputs 1 as the long/short select signal JJ (N). Only if all the saturation decision signals JL (N−1), JL (N), and JL (N+1) are 0, the long/short select signal generation unit 252 outputs 0 as the long/short select signal JJ (N).

The selector 254 selects and outputs one of the long-time signal (N) received from the long-time signal/decision signal holding unit 230 and the short-time signal (N) received from the short-time signal holding unit 240 in accordance with the long/short select signal JJ (N) received from the long/short select signal generation unit 252. For example, if the long/short select signal JJ (N) is 0, the selector 254 outputs the long-time signal (N), and if the long/short select signal JJ (N) is 1, the selector 254 outputs the short-time signal (N).

That is, the signal select unit 250 selects the short-time signal (N) of the pixel 12 on the N-th column when the saturation decision has been made on the long-time signal (N) of the pixel 12 on the N-th column. Even when no saturation decision has been made on the long-time signal (N) of the pixel 12 on the N-th column, when saturation decision has been made on the long-time signal (N−1) or the long time-signal (N+1) of the pixel 12 on the adjacent columns, the signal select unit 250 selects the short-time signal. The select signal unit 250 selects the long-time signal (N) of the pixel 12 on the N-th column only when no saturation decision has been made on the long-time signal (N) of the pixel 12 on the N-th column and the long-time signal (N−1) and the long-time signal (N+1) of the pixels 12 on columns adjacent to the N-th column.

FIG. 6C illustrates an example of the operation in the signal select unit 250. FIG. 6C illustrates an example of values of the long-time signal and the short-time signal output from the pixels 12 on the (N−3)-th to the (N+3)-th columns, the saturation decision signal JL corresponding to these long-time signals, and the long/short select signal JJ generated by the long/short select signal generation unit 252. In the example of FIG. 6C, the saturation decision signals JL (N−1), JL (N), and JL (N+1) are 1, 0, and 1, respectively, indicated in the frame surrounded by a dotted line. In this case, the long/short select signal JJ (N) is 1 as indicated in the truth table of FIG. 6B.

In such a way, the signal select unit 250 outputs the long/short select signal JJ (N) generated by the long/short select signal generation unit 252 and one of the long-time signal (N) and the short-time signal (N) selected by the selector 254 to the HDR composition unit 260.

Figure 7A:
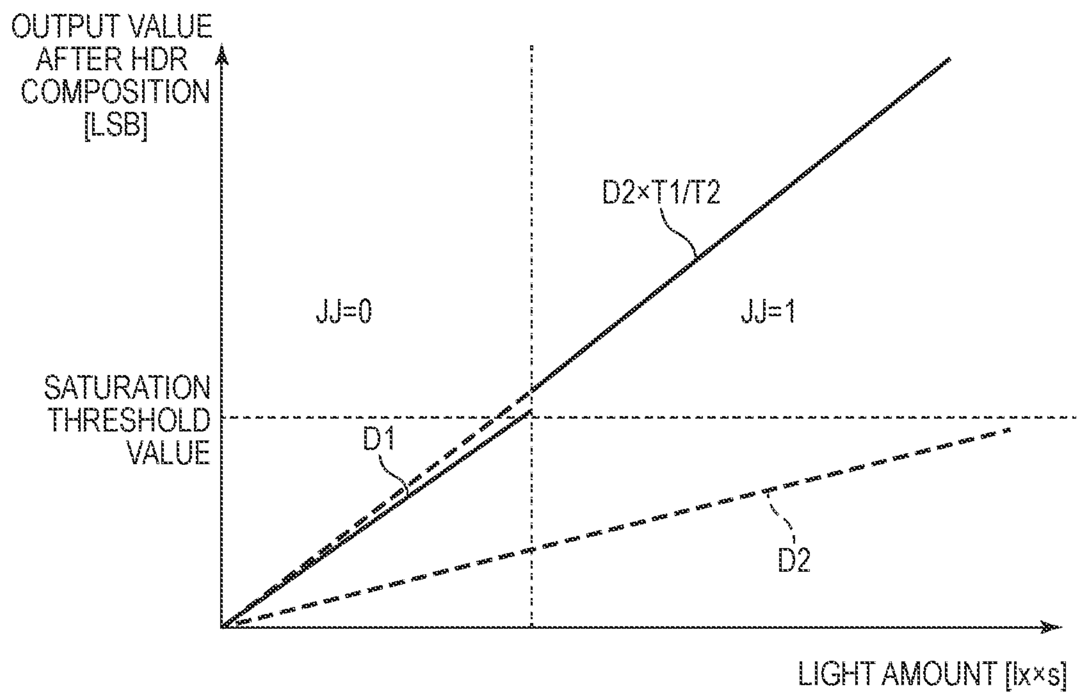
FIG. 7A and FIG. 7B are diagrams illustrating operations of an HDR composition unit in the imaging device according to the first embodiment of the present invention.
Figure 7B:
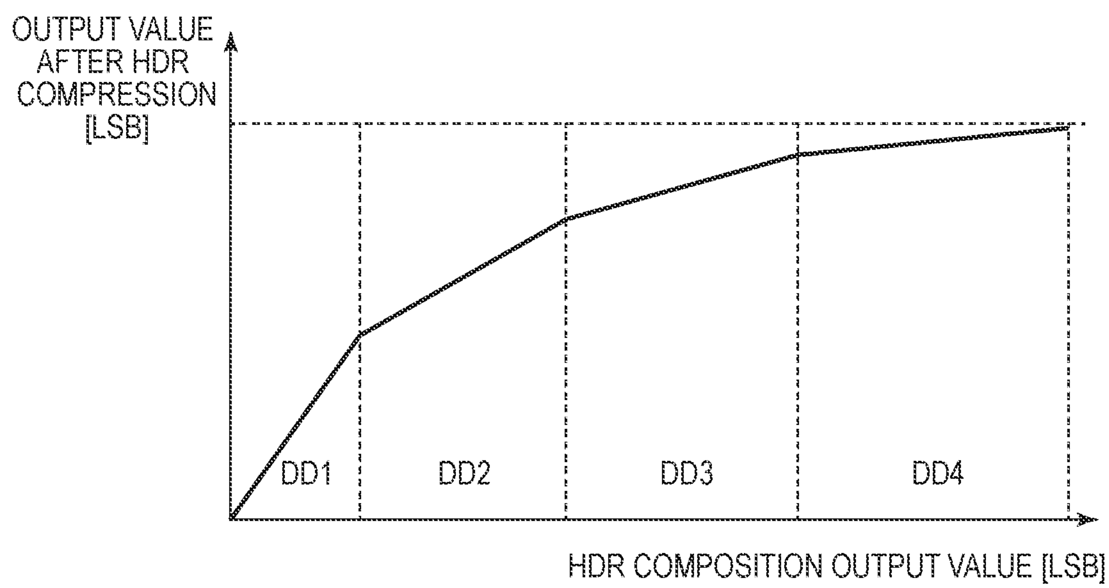

Next, the operation of the HDR composition unit 260 will be described by using FIG. 7A and FIG. 7B. FIG. 7A and FIG. 7B are diagrams illustrating operations of the HDR composition unit 260 in the imaging device according to the present embodiment.

The HDR composition unit 260 first performs an HDR composition process. FIG. 7A is a schematic diagram illustrating the outline of the HDR composition process performed in the HDR composition unit 260. The HDR composition process generates data in accordance with the long/short select signal JJ on a pixel 12 basis. That is, if the long/short select signal JJ is 0, a value of a long-time signal D1 is directly used as data of the corresponding pixel 12. If the long/short select signal JJ is 1, a value obtained by multiplying a short-time signal D2 by a rate T1/T2 is used as data of the corresponding pixel 12. Here, T1 is the accumulation time of signal charges from which the long-time signal is generated, and T2 is the accumulation time of signal charges from which the short-time signal is generated.

In the HDR composition unit 260, an HDR compression process is performed after the HDR composition process. FIG. 7B is a schematic diagram illustrating the outline of the HDR compression process performed in the HDR composition unit 260. In the HDR compression process, data generated by the HDR composition process (for example, 20 bits) is compressed into 12-bit data (=4096 [LSB]), for example. FIG. 7B illustrates an example in which data generated by the HDR composition process is compressed into 12-bit data by four times of polyline compression.

Figure 8A:
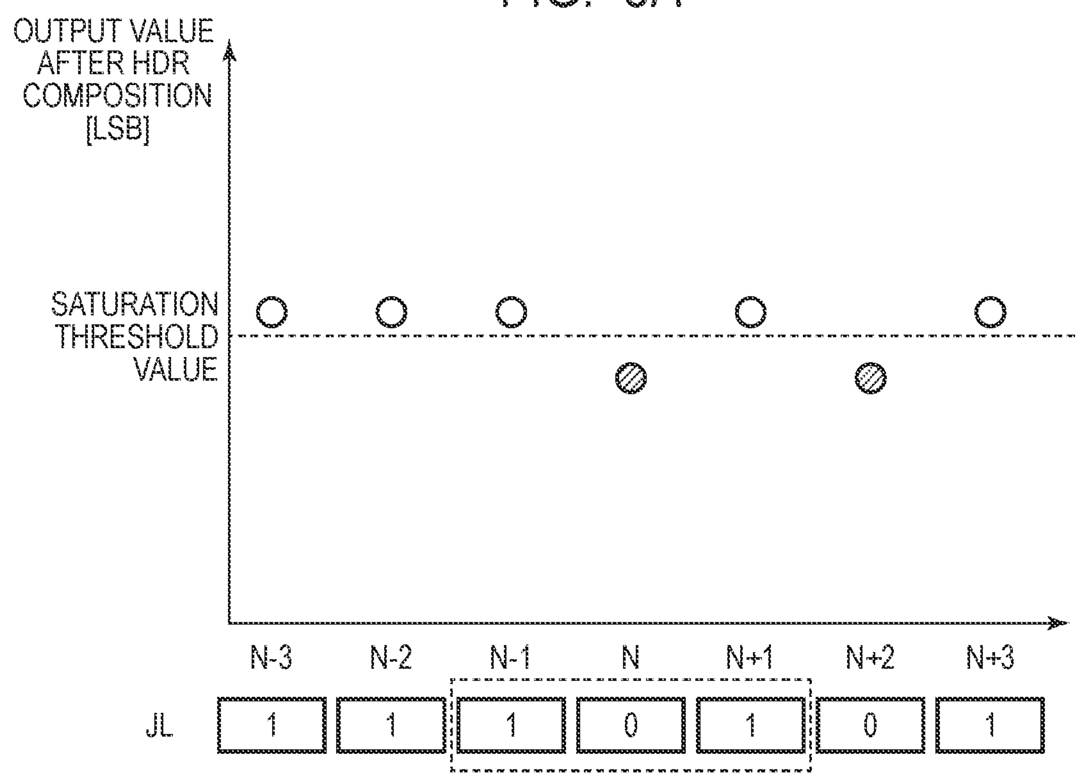
FIG. 8A and FIG. 8B are diagrams illustrating advantages of the imaging device according to the first embodiment of the present invention.
Figure 8B:
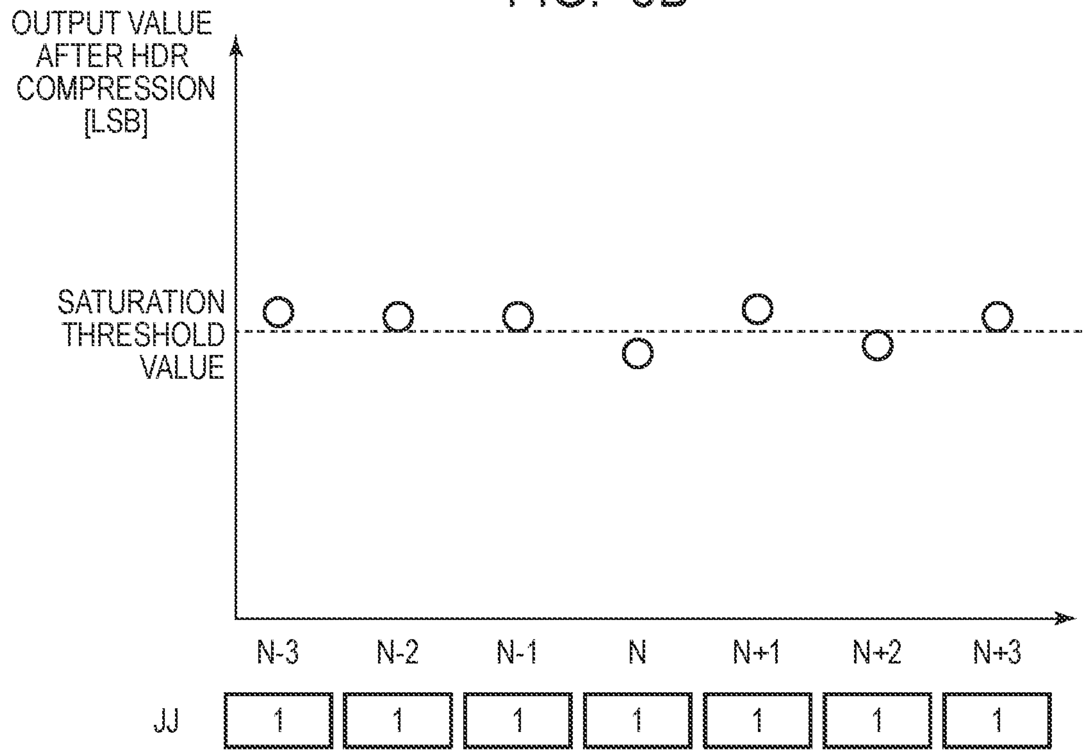

Next, the advantage of the imaging device according to the present embodiment will be described by using FIG. 8A and FIG. 8B. FIG. 8A and FIG. 8B are diagrams illustrating the advantage of the imaging device according to the present embodiment.

The value of the long-time signal D1 and the value obtained by multiplying the short-time signal D2 by the ratio T1/T2 are ideally the same. However, these values are not always the same due to a shift of the linearity, a shift of a black level of the circuit, or the like in practice.

In such a case, for example, as illustrated in FIG. 7A, a level difference will occur at the joining part between the line indicated by D1 and the line indicated by D2×T1/T2. With a level difference occurring at the joining part of the lines, variation between the value based on the long-time signal D1 and the value based on the short-time signal D2 will be notable near the saturation threshold value.

FIG. 8A is a graph illustrating a result obtained by performing an HDR composition process on signals of the pixels 12 from the (N−3)-th column to the (N+3)-the column of FIG. 6C by using the saturation decision signal JL. In this example, a value based on the short-time signal D2 and a value based on the long-time signal D1 occur in an alternating manner as the values of the pixels 12 from the (N−1)-th column to the (N+3)-the column. In such a case, with a level difference as illustrated in FIG. 7A occurring at the joining part of the lines, the variation in values between the pixels 12 adjacent to each other will be emphasized.

FIG. 8B is a graph illustrating a result obtained by performing an HDR composition process on signals of the pixels 12 from the (N−3)-th column to the (N+3)-the column of FIG. 6C by using the long/short select signal JJ. In the present embodiment, even with a signal of the pixel 12 in which the long-time signal D1 is not saturated, when the long-time signal D1 of the adjacent pixels 12 is saturated, a pixel value is calculated by using the value of the short-time signal D2. Therefore, all the values of the pixels 12 from the (N−1)-th column to the (N+3)-the column will be values based on the short-time signal D2. Therefore, in the imaging device according to the present embodiment, an HDR composition signal having small spatial variation can be obtained as illustrated in FIG. 8B.

As described above, according to the present embodiment, when a high dynamic range image is composed by using a long-time image and a short-time image, image quality at a joining part between the long-time image and the short-time image can be improved.

Second Embodiment

An imaging device according to a second embodiment of the present invention will be described with reference to FIG. 9A to FIG. 10B. The same component as that of the imaging device according to the first embodiment is labeled with the same reference, and the description thereof will be omitted or simplified. FIG. 9A, FIG. 9B, FIG. 10A, and FIG. 10B are diagrams illustrating a generation method of a long/short select signal in the imaging device according to the present embodiment.

The imaging device according to the present embodiment is the same as the imaging device according to the first embodiment except that the pixel 12 that provides the saturation decision signal JL used in generating the long/short select signal JJ is different. That is, in the first embodiment, the example in which the HDR composition process is performed taking into consideration of the long/short select signal JJ generated based on the saturation decision signals JL of adjacent two pixels 12 arranged on the same row as the target pixel 12 has been illustrated. In contrast, in the present embodiment, an HDR composition process is performed taking into consideration of the long/short select signal JJ generated based on the saturation decision signals JL of other pixels 12 included in a predetermined region including the target pixel 12. The predetermined region includes a plurality of columns adjacent to each other and a plurality of rows adjacent to each other.

FIG. 9A and FIG. 9B illustrate an application example to a monochrome sensor. FIG. 9A illustrates pixel arrangement in a monochrome sensor. In the pixel unit 10 of the monochrome sensor, pixels having sensitivity over a visible wavelength range (denoted as W in FIG. 9A) are arranged in a matrix. FIG. 9A illustrates 64 pixels 12 arranged from the (M−4)-th row to the (M+3)-th row and the (N−3)-th column to the (N+4)-th column out of the plurality of pixels 12 forming the pixel unit 10. Note that it can be considered that all the pixels 12 of the monochrome sensor have the color filters of the same color.

A pixel arranged at the M-th row, N-th column (a pixel surrounded by a bold line in FIG. 9A) is now focused on, and eight pixels 12 neighbor the circumference of the pixel. By generating the long/short select signal JJ based on the saturation decision signals JL provided from these eight pixels 12, it is possible to obtain an HDR composite signal having smaller spatial variation.

FIG. 9B illustrates one example of the process in the signal select unit 250 in the case of a monochrome sensor. In the example of FIG. 9B, a region of three rows by three columns including a pixel of interest at the center is extracted, and when there is at least one pixel whose saturation decision signal JL is 1 out of the eight pixels around the pixel of interest, the long/short select signal JJ is set to 1.

FIG. 10A and FIG. 10B illustrate an application example to a color sensor. FIG. 10A illustrates the pixel arrangement in a color sensor. In the pixel unit 10 of the color sensor, for example, R pixels having high sensitivity to red, G pixels having high sensitivity to green, and B pixels having high sensitivity to blue are arranged in accordance with so-called RGB Bayer color filter arrangement as illustrated in FIG. 10A. FIG. 10A illustrates 64 pixels 12 arranged from the (M−4)-th row to the (M+3)-th row and the (N−4)-th column to the (N+3)-th column out of the plurality of pixels 12 forming the pixel unit 10.

FIG. 10B illustrates one example of the process in the signal select unit 250 in the case of a color sensor. Also in the example of FIG. 10B, a region of three rows by three columns including a pixel of interest at the center is extracted. In the color sensor, however, since processes are performed on a pixel basis having a color filter of the same color in a color sensor, pixels from which saturation decision signals JL are acquired are selected from pixels having color filters of the same color as the pixel of interest. For example, when the R pixel is focused on, R pixels are arranged on the (N−4)-th column, the (N−2)-th column, the N-th column, and the (N+2)-th column on the (M−4)-th row, the (M−2)-th row, the M-th row, and the (M+2)-th row. Accordingly, for example, when the R pixel (the pixel surrounded by a bold line in FIG. 9A) arranged at the M-th row, the N-th column is a pixel of interest, the (M−2)-th row and (M+2)-th row are selected as rows around the R pixel of interest, and the (N−2)-th column and (N+2)-th column are selected as columns around the R pixel of interest.

In the region of three rows by three columns selected in such a way, eight R pixels are arranged around each pixel of interest at the center. Therefore, by generating the long/short select signal JJ based on the saturation decision signal JL provided from these eight R pixels, it is possible to obtain an HDR composite signal having smaller spatial variation. In the example of FIG. 10B, when there is at least one pixel whose saturation decision signal JL is 1 out of the eight pixels around the pixel of interest, the long/short select signal JJ is set to 1.

While the case of the R pixel is described here, the same process can apply to the G pixel and the B pixel.

Note that, while the example in which a region of three rows by three columns including a pixel of interest at the center is extracted and the long/short select signal JJ is acquired based on the saturation decision signal JL of other pixels included in this region has been illustrated in the present embodiment, a region from which the saturation decision signal JL is acquired is not limited thereto. For example, a region of five rows by five columns may be extracted, and the saturation decision signal JL may be acquired from more pixels.

Further, while the long/short select signal JJ is set to 1 when there is at least one pixel whose saturation decision signal JL is 1 out of the eight pixels around the pixel of interest in the present embodiment, a criterion for generating the long/short select signal JJ is also not limited thereto. For example, the long/short select signal JJ may be set to 1 when the number of pixels having the saturation decision signal JL of 1 is larger than the number of pixels having the saturation decision signal JL of 0.

As described above, according to the present embodiment, when composing a high dynamic range image by using a long-time image and a short-time image, image quality at a joining part between the long-time image and the short-time image can be improved.

Third Embodiment

An imaging device according to a third embodiment of the present invention will be described with reference to FIG. 11 to FIG. 15. The same component as that of the imaging device according to the first and second embodiments is labeled with the same reference, and the description thereof will be omitted or simplified.

Figure 11:
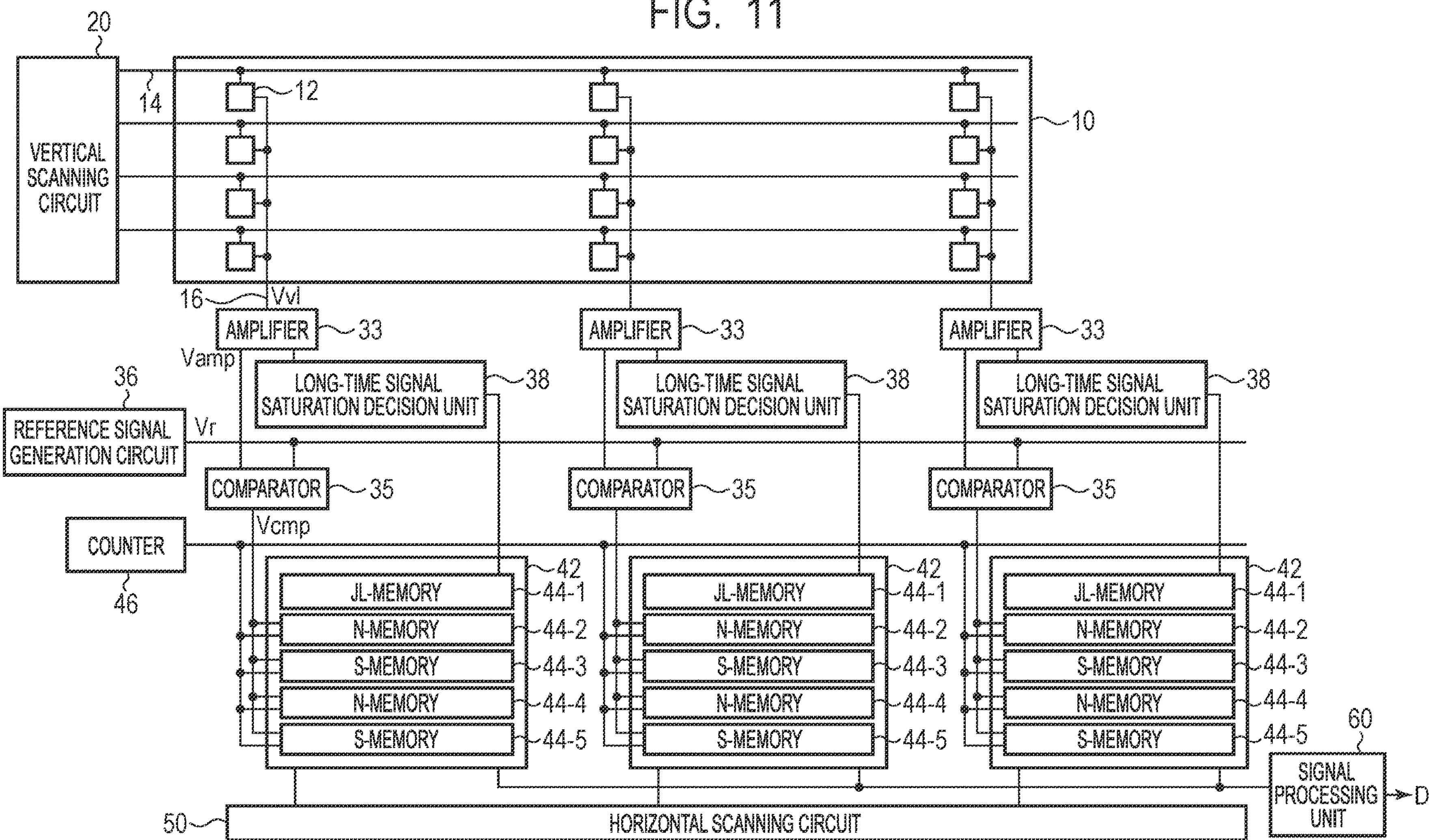
FIG. 11 is a block diagram illustrating a general configuration of an imaging element in an imaging device according to a third embodiment of the present invention.
Figure 12:
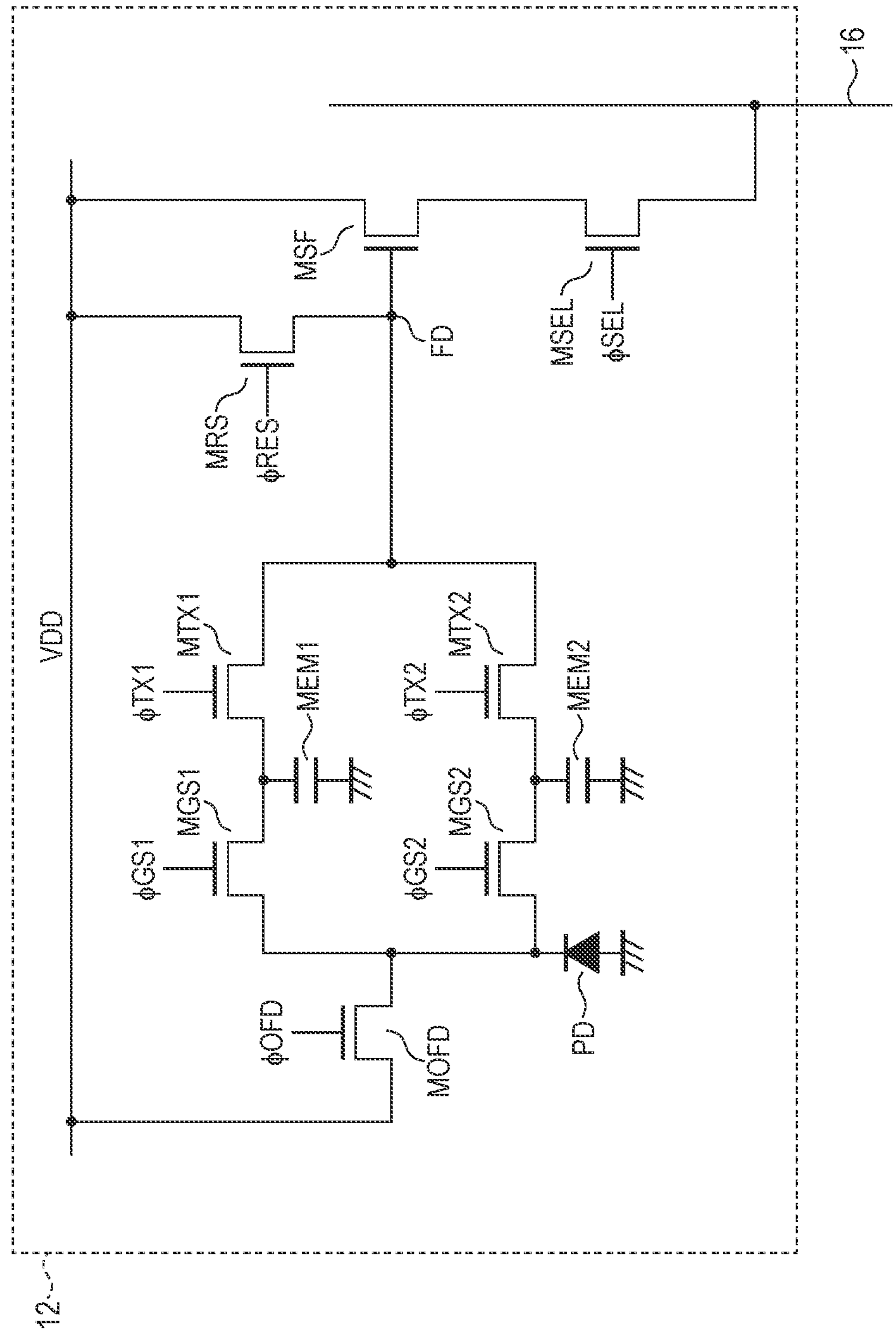
FIG. 12 is a circuit diagram illustrating a configuration example of pixels of the imaging element in the imaging device according to the third embodiment of the present invention.

First, the structure of the imaging device according to the present embodiment will be described by using FIG. 11 and FIG. 12. FIG. 11 is a block diagram illustrating a general configuration of an imaging element in the imaging device in accordance with the present embodiment. FIG. 12 is a circuit diagram illustrating a configuration example of pixels of the imaging element in the imaging device in accordance with the present embodiment. Note that the entire configuration of the imaging device according to the present embodiment is basically the same as the imaging device according to the first embodiment illustrated in FIG. 1.

As illustrated in FIG. 11, the imaging element 100 of the imaging device according to the present embodiment is basically the same as the imaging element 100 of the imaging device according to the first embodiment illustrated in FIG. 2 except that long-time signal saturation decision units 38 are further provided in association with respective columns of the pixel unit 10. That is, the imaging device according to the present embodiment is different from the imaging device according to the first embodiment, which performs saturation decision of a long-time signal at the signal processing unit 200, in that the saturation decision of a long-time signal is performed at the imaging element 100 in parallel with respect to columns.

The memory 42 on each column includes a JL-memory 44-1, an N-memory 44-2, an S-memory 44-3, an N-memory 44-4, and an S-memory 44-5. The JL-memory 44-1 is a memory for holding the saturation decision signal JL output from the long-time signal saturation decision unit 38. The N-memory 44-2 is a memory for holding, as a digital signal N1, an N-signal of a long-time signal output from the pixel 12. The S-memory 44-3 is a memory for holding, as a digital signal S1, an S-signal of a long-time signal output from the pixel 12. The N-memory 44-4 is a memory for holding, as a digital signal N2, an N-signal of a short-time signal output from the pixel 12. The S-memory 44-5 is a memory for holding, as a digital signal S2, an S-signal of a short-time signal output from the pixel 12.

A signal Vvl of each of the pixels 12 is read out to the vertical signal line 16 on the corresponding column on a row basis by the vertical scanning circuit 20. The amplifier 33 on each column amplifies the signal Vvl read out from the pixel 12 via the vertical signal line 16 on the corresponding column at a predetermined gain and outputs the amplified signal Vamp to the comparator 35 and the long-time signal saturation decision unit 38. The long-time signal saturation decision unit 38 on each column decides whether or not the level of the long-time signal amplified by the amplifier 33 on the corresponding column exceeds the level of a preset predetermined saturation threshold value and outputs the saturation decision signal JL indicating a decision result. The saturation decision signal JL is held in the JL-memory 44-1 on the memory 42 on the corresponding column.

The reference signal generation circuit 36 outputs, to the comparator 35, a reference signal Vr whose signal level changes at a constant rate with time. The comparator 35 on each column compares the signal level of signal Vamp output from the amplifier 33 on the corresponding column with the signal level of the reference signal Vr and outputs the signal Vcmp indicating a comparison result. The counter 46 outputs a count signal indicating a count value that is a counting value of the clock signal to the memory 42 on each column. The memory 42 on each column holds, as a digital signal obtained by performing AD conversion on the signal Vcmp, a count signal received from the counter 46 when the signal level of the signal Vcmp changes. The memory 42 holds the digital signal obtained by AD conversion in any of the N-memory 44-2, the S-memory 44-3, the N-memory 44-4, and the S-memory 44-5 in accordance with the type of the signal.

As illustrated in FIG. 12, each of the pixels 12 includes a photodiode PD, transfer transistors MGS1, MGS2, MTX1, and MTX2, and a charge drain transistor MOFD. Each of the pixels 12 further includes a reset transistor MRS, an amplifier transistor MSF, and a select transistor MSEL.

The photodiode PD has the anode connected to a reference voltage node and the cathode connected to the source of the transfer transistor MGS1, the source of the transfer transistor MGS2, and the source of the charge drain transistor MOFD. The drain of the transfer transistor MGS1 is connected to the source of the transfer transistor MTX1. The connection node of the drain of the transfer transistor MGS1 and the source of the transfer transistor MTX1 includes a capacitance component and functions as a charge holding portion MEM1. The drain of the transfer transistor MGS2 is connected to the source of the transfer transistor MTX2. The connection node of the drain of the transfer transistor MGS2 and the source of the transfer transistor MTX2 includes a capacitance component and functions as a charge holding portion MEM2.

The drain of the transfer transistor MTX1 and the drain of the transfer transistor MTX2 are connected to the source of the reset transistor MRS and the gate of the amplifier transistor MSF. The connection node of the drain of the transfer transistor MTX1, the drain of the transfer transistor MTX2, the source of the reset transistor MRS, and the gate of the amplifier transistor MSF is a so-called floating diffusion FD. The floating diffusion FD includes a capacitance component, functions as a charge holding portion, and forms a charge-to-voltage conversion unit made of such a capacitance component. The drain of the charge drain transistor MOFD, the drain of the reset transistor MRS, and the drain of the amplifier transistor MSF are connected to a power supply node (voltage VDD). The source of the amplifier transistor MSF is connected to the drain of the select transistor MSEL. The source of the select transistor MSEL, which is also the output node of the pixel 12, is connected to the vertical signal line 16.

Once an optical image of an object enters the pixel unit 10, the photodiode PD of each pixel 12 converts (photo-electrically converts) the incident light into an amount of charges in accordance with the light amount thereof and accumulates the generated charges. When turned on, the charge drain transistor MOFD drains charges of the photodiode PD to reset the photodiode PD to a voltage in accordance with the voltage VDD. By turning off the charge drain transistor MOFD, it is possible to start accumulation of charges in the photodiode PD. When turned on, the transfer transistor MGS1 transfers charges of the photodiode PD to the charge holding portion MEM1. When turned on, the transfer transistor MTX1 transfers charges of the charge holding portion MEM1 to the floating diffusion FD. Similarly, when turned on, the transfer transistor MGS2 transfers charges of the photodiode PD to the charge holding portion MEM2. When turned on, the transfer transistor MTX2 transfers charges of the charge holding portion MEM2 to the floating diffusion FD.

The floating diffusion FD has a voltage in accordance with the amount of charges transferred from the charge holding portion MEM1 or MEM2 due to charge-to-voltage conversion caused by the capacitance component of the floating diffusion FD. The amplifier transistor MSF is configured such that the voltage VDD is supplied to the drain and a bias current is supplied to the source from a current source (not illustrated) via the select transistor MSEL and forms an amplifier unit (source follower circuit) whose input node is the gate. Thereby, the amplifier transistor MSF outputs the signal Vvl based on the voltage of the floating diffusion FD to the vertical signal line 16 via the select transistor MSEL. When turned on, the reset transistor MRS resets the floating diffusion FD to a voltage in accordance with the voltage VDD.

In the case of the pixel 12 having a circuit configuration illustrated in FIG. 12, the control line 14 on each row includes a signal line connected to the gate of the transfer transistor MGS1 and a signal line connected to the gate of the transfer transistor MGS2. The control line 14 on each row further includes a signal line connected to the gate of the transfer transistor MTX1 and a signal line connected to the gate of the transfer transistor MTX2. The control line 14 on each row further includes a signal connected to the gate of the charge drain transistor MOFD, a signal line connected to the gate of the reset transistor MRS, and a signal line connected to the gate of the select transistor MSEL.

The transfer transistor MGS1 is supplied with a control signal ϕGS1 from the vertical scanning circuit 20 via the control line 14. The transfer transistor MGS2 is supplied with a control signal ϕGS2 from the vertical scanning circuit 20 via the control line 14. The transfer transistor MTX1 is supplied with a control signal ϕTX1 from the vertical scanning circuit 20 via the control line 14. The transfer transistor MTX2 is supplied with a control signal ϕTX2 from the vertical scanning circuit 20 via the control line 14. The charge drain transistor MOFD is supplied with a control signal ϕOFD from the vertical scanning circuit 20 via the control line 14. The reset transistor MRS is supplied with a control signal ϕRES from the vertical scanning circuit 20 via the control line 14. The select transistor MSEL is supplied with a control signal ϕSEL from the vertical scanning circuit 20 via the control line 14. The plurality of pixels 12 within the pixel unit 10 are controlled on a row basis by control signals ϕGS1, ϕGS2, ϕTX1, ϕTX2, ϕRES, and ϕSEL supplied from the vertical scanning circuit 20. When each transistor of the pixel 12 is formed of an n-channel transistor, the corresponding transistor is in an on-state when the above control signal is at a High level (H level), and the corresponding transistor is in an off-state when the above control signal is at a Low level (L level).

Figure 13:
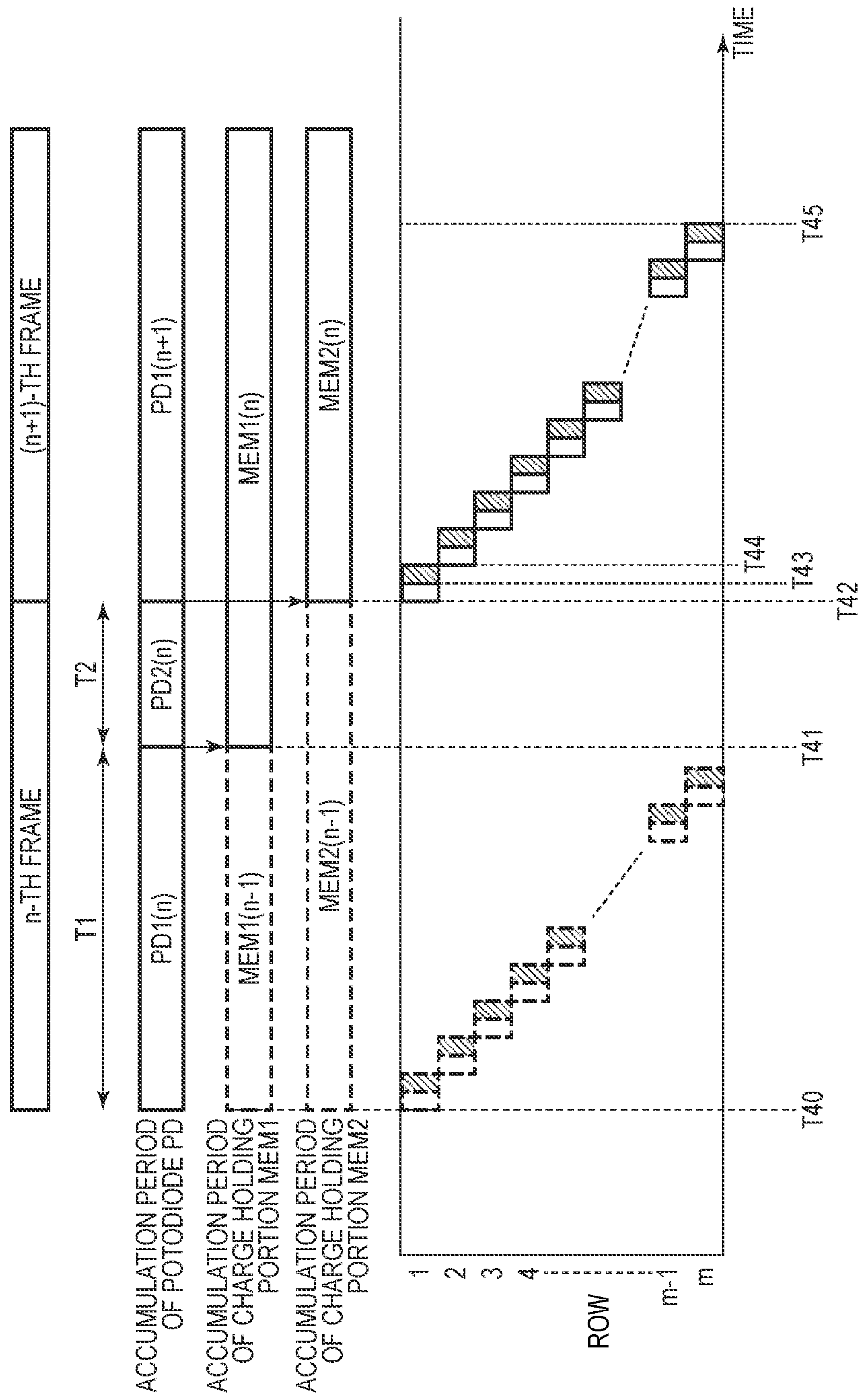
FIG. 13 is a timing diagram illustrating a readout operation of the imaging element in the imaging device according to the third embodiment of the present invention.

Next, the operation timing of the imaging element 100 will be described by using FIG. 13. FIG. 13 is a timing diagram illustrating a readout operation of the imaging element in the imaging device according to the present embodiment.

A readout operation of a signal in a certain frame is started at time T40, for example. Time T40 is the time when a readout operation of a long-time signal of the pixel 12 on the first row in the frame is started.

At time T40, the control signal ϕOFD is controlled to the H level to reset the photodiode PD, and the control signal ϕOFD is then controlled to the L level to start accumulation of charges in the photodiode PD.

Next, at time T41, the control signal ϕGS1 is controlled to the H level to transfer charges accumulated in the photodiode PD during the period from time T40 to time T41 to the charge holding portion MEM1. Here, the period from time T40 to time T41 is the accumulation time T1 corresponding to a long-time signal. The control signal ϕGS1 is controlled to the L level to end the transfer of charges to the charge holding portion MEM1, and the control signal ϕOFD is then controlled to the H level to reset the photodiode PD. The control signal ϕOFD is then controlled to the L level to re-start accumulation of charges in the photodiode PD.

Next, at time T42, the control signal ϕGS2 is controlled to the H level to transfer charges accumulated in the photodiode PD during the period from time T41 to time T42 to the charge holding portion MEM2. Here, the period from time T41 to time T42 is the accumulation time T2 corresponding to a short-time signal. The control signal ϕGS2 is controlled to the L level to end the transfer of charges to the charge holding portion MEM2, and the control signal ϕOFD is then controlled to the H level to reset the photodiode PD. The control signal ϕOFD is then controlled to the L level to re-start accumulation of charges in the photodiode PD.

Next, in the period from time T42 to time T45, a readout operation of a signal based on charges held in the charge holding portion MEM1 (long-time signal) and a readout operation of a signal based on charges held in the charge holding portion MEM2 (short-time signal) are performed on each of the pixels 12 sequentially on a row basis. For example, the period from time T42 to time T43 is a period in which a signal based on charges accumulated in the charge holding portion MEM1 of the pixel 12 on the first row (long-time signal) is read out. The period from time T43 to time T44 is a period in which a signal based on charges accumulated in the charge holding portion MEM2 of the pixel 12 on the first row (short-time signal) is read out. Readout operations of a long-time signal and a short-time signal from the pixel 12 on the second and subsequent rows are performed sequentially on a row basis on and after time T44.

In a readout operation of a long-time signal, after the floating diffusion FD is reset, charges accumulated in the charge holding portion MEM1 are transferred to the floating diffusion FD, and a signal in accordance with the voltage of the floating diffusion FD is output to the vertical signal line 16. In a readout operation of a short-time signal, after the floating diffusion FD is reset, charges accumulated in the charge holding portion MEM2 are transferred to the floating diffusion FD, and a signal in accordance with the voltage of the floating diffusion FD is output to the vertical signal line 16. Such a series of readout operations are performed for respective rows under the control of the vertical scanning circuit 20, and the time of the end of a readout operation of the pixel 12 on the m-th row, which is the last row, is time T45.

Figure 14:
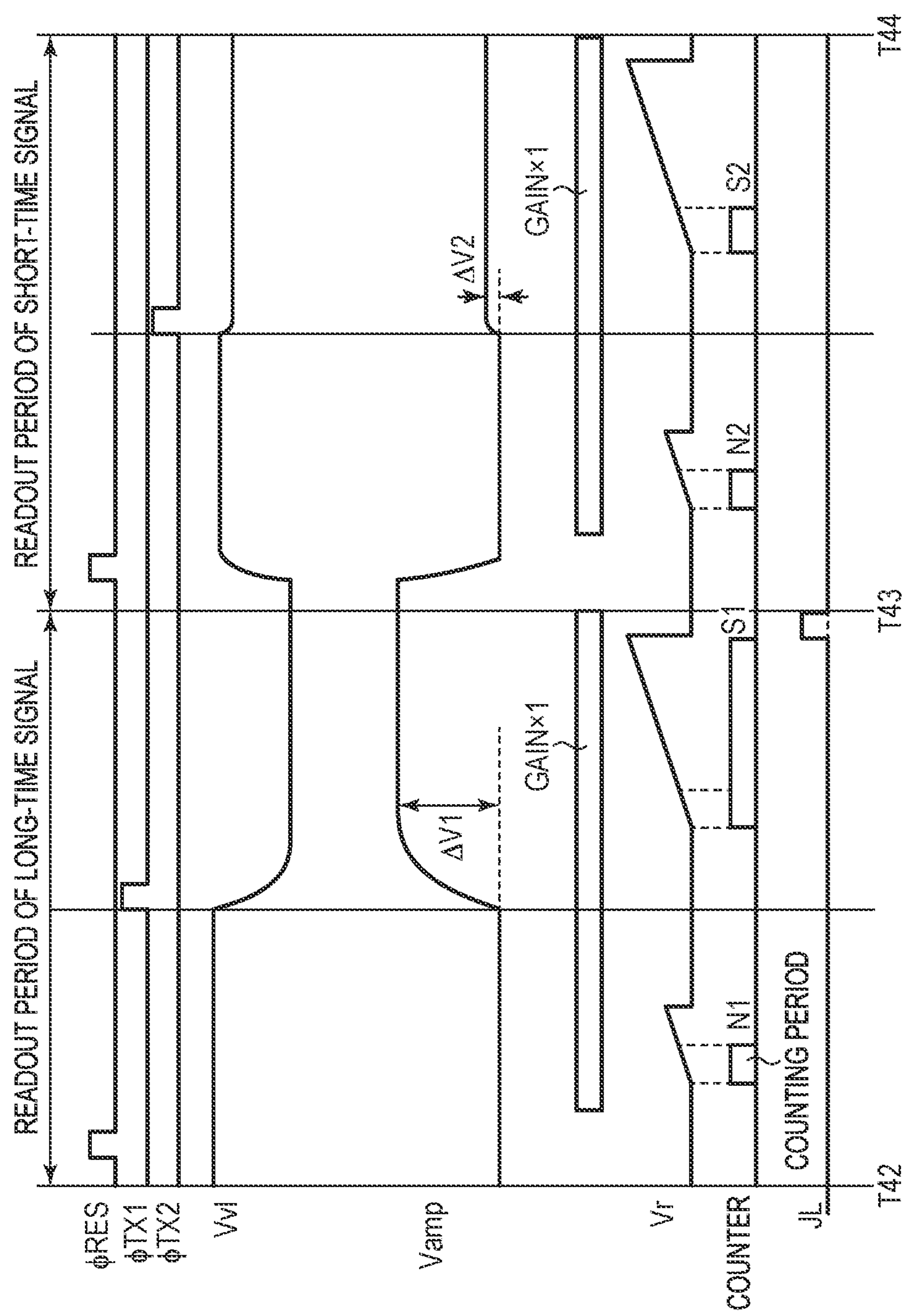
FIG. 14 is a timing diagram illustrating a readout operation on one row of the imaging element in the imaging device according to the third embodiment of the present invention.

Next, a readout operation for one row in the imaging element 100 will be described more specifically by using FIG. 14. FIG. 14 is a timing diagram illustrating a readout operation for one row of the imaging element in the imaging device according to the present embodiment.

As described previously, in a pixel on the first row, the period from time T42 to time T43 is a readout period for a long-time signal corresponding to the accumulation time T1, and the period from time T43 to time T44 is a readout period for a short-time signal corresponding to the accumulation time T2. Note that, while the example in which a long-time signal is read out and then a short-time signal is read out is described here, a short-time signal may be read out and then a long-time signal may be read out.

First, an operation from time T42 to time T43, which is a readout period for a long-time signal of the pixel 12 on the first row, will be described.

In the initial state where the pixel 12 on the first row is selected, the control signal ϕRES is temporarily controlled to the H level by the vertical scanning circuit 20, and the voltage of the floating diffusion FD of the pixel 12 is reset. Thereby, a signal (N-signal) in accordance with the reset voltage of the floating diffusion FD is output to the vertical signal line 16 as the signal Vvl. Note that the N-signal corresponding to a long-time signal is here referred to as "N1-signal".

Further, in parallel to a reset operation of the floating diffusion FD, the reset signal of the amplifier 33 is temporarily controlled to the H level, and the output of the amplifier 33 (signal Vamp) is reset. After the control signal ϕRES is controlled to the L level by the vertical scanning circuit 20 and the reset operation of the floating diffusion FD of the pixel 12 ends, the reset signal of the amplifier 33 is controlled to the L level and the reset operation of the amplifier 33 ends. Thereby, the N1-signal amplified at a predetermined gain (one-fold in this example) set in the amplifier 33 is output from the amplifier 33 as the signal Vamp.

Next, an AD conversion process is performed on the signal Vamp output from the amplifier 33. Hereafter, AD conversion performed on the N1-signal is referred to as "N1 conversion". The reference signal generation circuit 36 starts changing the reference signal Vr at a constant rate. Further, the counter 46 starts counting in synchronization with the start of a change in the reference signal Vr and outputs a count signal indicating a count value to the memory 42 on each column.

The comparator 35 compares the signal level of the signal Vamp with the signal level of the reference signal Vr and outputs a latch signal Vcmp to the memory 42 at a timing when the compared signal levels become the same. The memory 42 latches the count value received from the counter 46 at a timing of receiving the latch signal Vcmp from the comparator 35 and holds the value in the N-memory 44-2. The count value held in the N-memory 44-2 corresponds to the digital N1-signal obtained by performing AD conversion on the N1-signal.

Next, the control signal ϕTX1 is temporarily controlled to the H level by the vertical scanning circuit 20, and charges held in the charge holding portion MEM1 are transferred to the floating diffusion FD. Thereby, a signal (S-signal) in accordance with the amount of charges transferred to the floating diffusion FD is output to the vertical signal line 16 as the signal Vvl. Note that the S-signal corresponding to the long-time signal is here referred to as "S1-signal". The S1-signal amplified at a predetermined gain (one-fold in this example) set in the amplifier 33 is then output from the amplifier 33 as the signal Vamp. Thereby, the output voltage of the signal Vamp increases by a voltage ΔV1 corresponding to the S1-signal.

Next, an AD conversion process is performed on the signal Vamp output from the amplifier 33. Hereafter, AD conversion performed on the S1-signal is referred to as "S1 conversion". The reference signal generation circuit 36 starts changing the reference signal Vr at a constant rate. Further, the counter 46 starts counting in synchronization with the start of a change in the reference signal Vr and outputs a count value to the memory 42 on each column.

The comparator 35 compares the signal level of the signal Vamp with the signal level of the reference signal Vr and outputs a latch signal Vcmp to the memory 42 at a timing when the compared signal levels become the same. The memory 42 latches the count value received from the counter 46 at a timing of receiving the latch signal Vcmp from the comparator 35 and holds the value in the S-memory 44-3. The count value held in the S-memory 44-3 corresponds to the digital S1-signal obtained by performing AD conversion on the S1-signal.

On the other hand, when the signal level of the signal Vamp is greater than or equal to a preset saturation level and Vamp is always greater than Vr during the S1 conversion period, the long-time signal saturation decision unit 38 outputs, to the memory 42, the saturation decision signal JL that has the H level at the end of the S1 conversion period. The saturation decision signal JL is held in the JL memory 44-1 of the memory 42.

Next, an operation from time T43 to time T44, which is a readout period for a short-time signal of the pixel 12 on the first row, will be described.

The state where the pixel 12 on the first row is selected continues from the readout period of a long-time signal. In this state, the control signal ϕRES is temporarily controlled to the H level by the vertical scanning circuit 20, and the voltage of the floating diffusion FD of the pixel 12 is reset. Thereby, a signal (N-signal) in accordance with the reset voltage of the floating diffusion FD is output to the vertical signal line 16 as the signal Vvl. Note that the N-signal corresponding to a short-time signal is here referred to as "N2-signal".

Further, in parallel to a reset operation of the floating diffusion FD, the reset signal of the amplifier 33 is temporarily controlled to the H level, and the output of the amplifier 33 (signal Vamp) is reset. After the control signal ϕRES is controlled to the L level by the vertical scanning circuit 20 and the reset operation of the floating diffusion FD of the pixel 12 ends, the reset signal of the amplifier 33 is controlled to the L level and the reset operation of the amplifier 33 ends. Thereby, the N2-signal amplified at a predetermined gain (one-fold in this example) set in the amplifier 33 is output from the amplifier 33 as the signal Vamp.

Next, an AD conversion process is performed on the signal Vamp output from the amplifier 33. Hereafter, AD conversion performed on the N2-signal is referred to as "N2 conversion". The reference signal generation circuit 36 starts changing the reference signal Vr at a constant rate.

Further, the counter 46 starts counting in synchronization with the start of a change in the reference signal Vr and outputs a count signal indicating a count value to the memory 42 on each column.

The comparator 35 compares the signal level of the signal Vamp with the signal level of the reference signal Vr and outputs a latch signal Vcmp to the memory 42 at a timing when the compared signal levels become the same. The memory 42 latches the count value received from the counter 46 at a timing of receiving the latch signal Vcmp from the comparator 35 and holds the value in the N-memory 44-4. The count value held in the N-memory 44-4 corresponds to the digital N2-signal obtained by performing AD conversion on the N2-signal.

Next, the control signal ϕTX2 is temporarily controlled to the H level by the vertical scanning circuit 20, and charges held in the charge holding portion MEM2 are transferred to the floating diffusion FD. Thereby, a signal (S-signal) in accordance with the amount of charges transferred to the floating diffusion FD is output to the vertical signal line 16 as the signal Vvl. Note that the S-signal corresponding to the short-time signal is here referred to as "S2-signal". The S2-signal amplified at a predetermined gain (one-fold in this example) set in the amplifier 33 is output from the amplifier 33 as the signal Vamp. Thereby, the output voltage of the signal Vamp increases by a voltage ΔV2 corresponding to the S2-signal.

Next, an AD conversion process is performed on the signal Vamp output from the amplifier 33. Hereafter, AD conversion performed on the S2-signal is referred to as "S2 conversion". The reference signal generation circuit 36 starts changing the reference signal Vr at a constant rate. Further, the counter 46 starts counting in synchronization with the start of a change in the reference signal Vr and outputs a count signal indicating a count value to the memory 42 on each column.

The comparator 35 compares the signal level of the signal Vamp with the signal level of the reference signal Vr and outputs a latch signal Vcmp to the memory 42 at a timing when the compared signal levels become the same. The memory 42 latches the count value received from the counter 46 at a timing of receiving the latch signal Vcmp from the comparator 35 and holds the value in the S-memory 44-5. The count value held in the S-memory 44-5 corresponds to the digital S2-signal obtained by performing AD conversion on the S2-signal.

In such a way, the saturation decision signal JL, the digital N1-signal, the digital S1-signal, the digital N2-signal, and the digital S2-signal are held in the memory 42 on each column. These digital signals held in the memory 42 on each column are transferred to the signal processing unit 60 sequentially on a column basis in accordance with a control signal supplied from the horizontal scanning circuit 50.

Figure 15:
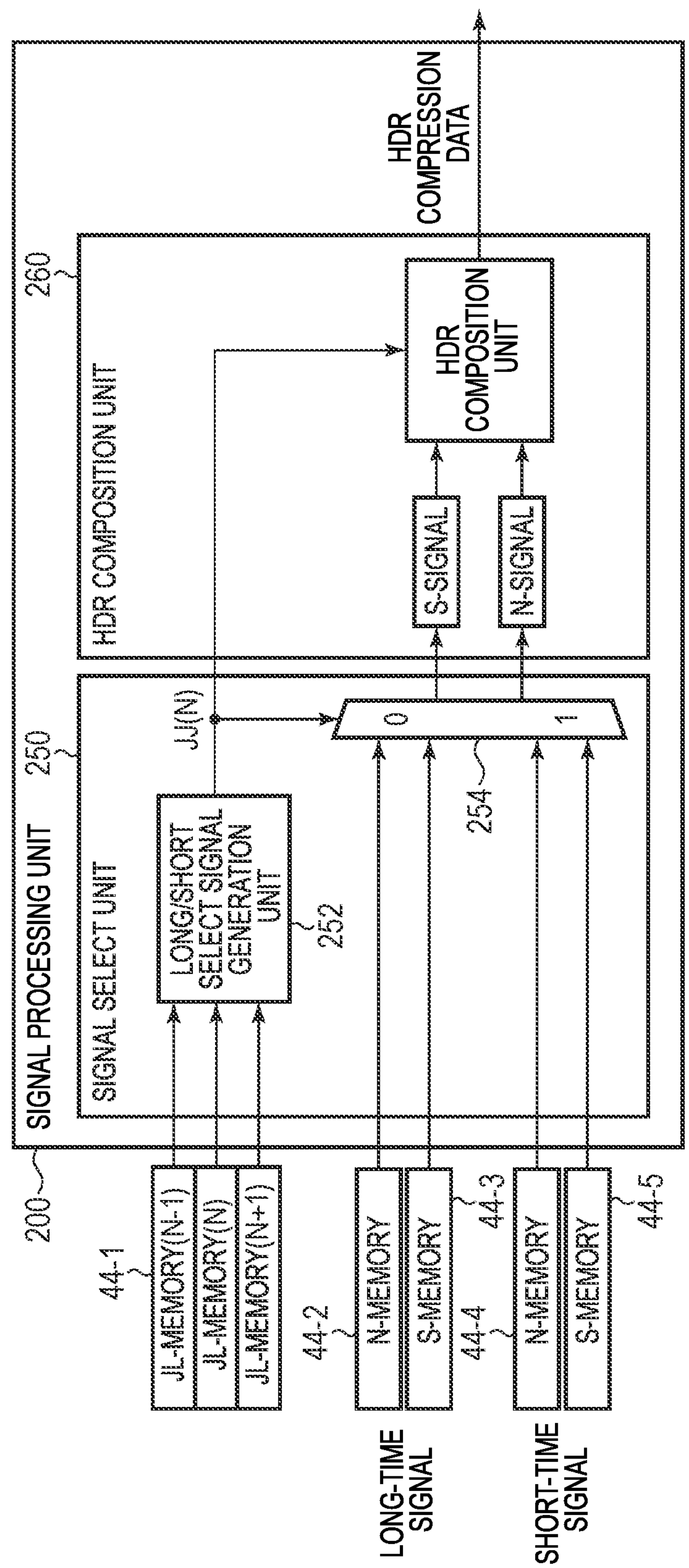
FIG. 15 is a diagram illustrating a configuration and an operation of a signal processing unit in the imaging device according to the third embodiment of the present invention.

Next, the configuration and the operation of the signal processing unit 200 will be described by using FIG. 15. FIG. 15 is a diagram illustrating the configuration and the operation of the signal processing unit 200 in the imaging device according to the present embodiment.

As illustrated in FIG. 15, the signal processing unit 200 of the imaging device according to the present embodiment includes the signal select unit 250 and the HDR composition unit 260. The signal select unit 250 includes the long/short select signal generation unit 252 and the selector 254.

The long/short select signal generation unit 252 holds the saturation decision signals JL received from the imaging element 100 for a plurality of pixels. In a case of a monochrome sensor, the long/short select signal generation unit 252 holds a saturation decision signal JL(N−1) corresponding to the pixel 12 on the (N−1)-th column, a saturation decision signal JL(N) corresponding to the pixel 12 on the N-th column, and a saturation decision signal JL(N+1) corresponding to the pixel 12 on the (N+1)-th column. Further, the long/short select signal generation unit 252 generates a long/short select signal JJ(N) corresponding to the pixel 12 on the N-th column based on the saturation decision signals JL(N−1), JL(N), and JL(N+1) and transmits the generated long/short select signal JJ(N) to the selector 254.

If the saturation decision signal JL(N) is 1, a long/short select signal JJ(N) of 1 is output unconditionally. Even if the saturation decision signal JL(N) is 0, if one of the saturation decision signal JL(N−1) and the saturation decision signal JL(N+1) is 1, a long/short select signal JJ(N) of 1 is output. Only if all the saturation decision signals JL(N−1), JL(N), and JL(N+1) are 0, a long/short select signal JJ(N) of 0 is output.

The selector 254 selects and outputs one of the long-time signal (N) and the short-time signal (N) received from the imaging element 100 in accordance with the long/short select signal JJ(N) received from the long/short select signal generation unit 252. In this example, the long-time signal (N) corresponds to the digital N1-signal transferred from the N-memory 44-2 and the digital S1-signal transferred from the S-memory 44-3. Further, the short-time signal (N) corresponds to the digital N2-signal transferred from the N-memory 44-4 and the digital S2-signal transferred from the S-memory 44-5. For example, if the long/short select signal JJ(N) is 0, the long-time signal (N) is output, and if the long/short select signal JJ(N) is 1, the short-time signal is output.

In such a way, the signal select unit 250 outputs, to the HDR composition unit 260, the long/short select signal JJ(N) generated by the long/short select signal generation unit 252 and a signal selected by the selector 254 out of a long-time signal (N) and a short-time signal (N).

After removing a noise component by performing a calculation process to subtract the N-signal from the S-signal, the HDR composition unit 260 performs an HDR composition process and an HDR compression process and outputs HDR compression data by using the scheme described in the first embodiment, for example.

Also in the imaging device according to the present embodiment, as with the first embodiment, even with a signal of the pixel in which the long-time signal is not saturated, when the long-time signal of the adjacent pixels is saturated, a pixel value is calculated by using the value of the short-time signal. Therefore, an HDR composition signal having small spatial variation can be obtained also by the imaging device of the present embodiment. Furthermore, since saturation decision processes are performed in parallel with respect to columns inside the imaging device in the present embodiment, a faster decision process is possible. Further, since a signal select process is performed inside the imaging device, a band of data transmitted to the outside of the imaging device can also be reduced.

As described above, according to the present embodiment, when composing a high dynamic range image by using a long-time image and a short-time image, image quality at a joining part between the long-time image and the short-time image can be improved.

Fourth Embodiment

An imaging device according to a fourth embodiment of the present invention will be described with reference to FIG. 16 to FIG. 18B. The same component as that of the imaging device according to the first to third embodiments is labeled with the same reference, and the description thereof will be omitted or simplified.

Figure 16:
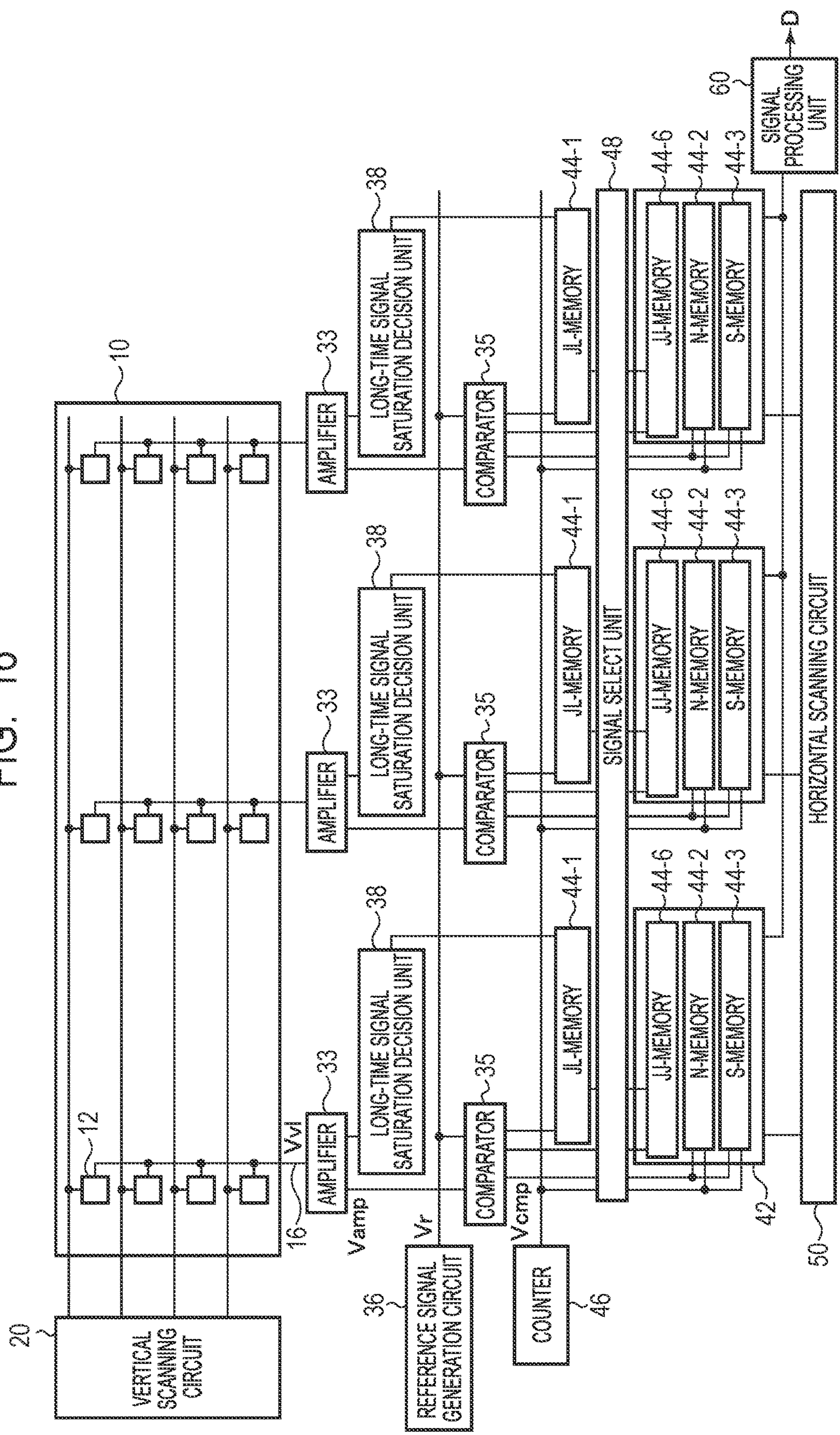
FIG. 16 is a block diagram illustrating a general configuration of an imaging element in an imaging device according to a fourth embodiment of the present invention.

First, the structure of the imaging device according to the present embodiment will be described by using FIG. 16. FIG. 16 is a block diagram illustrating a general configuration of an imaging element in the imaging device in accordance with the present embodiment. Note that the entire configuration of the imaging device according to the present embodiment is basically the same as the imaging device according to the first embodiment illustrated in FIG. 1.

As illustrated in FIG. 16, the imaging element 100 of the imaging device according to the present embodiment includes a signal select unit 48 corresponding to the signal select unit 250 in the first to third embodiments on each column. Further, the JL-memory 44-1 is provided separately from the memory 42 and connected to the memory 42 via the signal select unit 48. Further, the memories 42 share the N-memory 44-2 as a memory used for holding the N1-signal of a long-time signal and the N2-signal of a short-time signal and share the S-memory 44-3 as a memory used for holding the S1-signal of a long-time signal and the S2-signal of a short-time signal. The memory 42 further includes a JJ-memory 44-6. Other features are basically the same as the imaging element of the imaging device according to the third embodiment illustrated in FIG. 11.

The signal Vvl output from each of the pixels 12 is read out to the vertical signal line 16 on the corresponding column on a row basis by the vertical scanning circuit 20. The amplifier 33 on each column amplifies the signal Vvl read out from the pixel 12 via the vertical signal line 16 on the corresponding column at a predetermined gain and outputs the amplified signal Vamp to the comparator 35 and the long-time signal saturation decision unit 38. The long-time signal saturation decision unit 38 on each column decides whether or not the level of a signal amplified by the amplifier 33 on the corresponding column exceeds the level of a preset predetermined saturation threshold value and outputs the saturation decision signal JL indicating a decision result to the JL-memory 44-1 on the corresponding column. The JL-memory 44-1 holds the saturation decision signal JL received from the long-time signal saturation decision unit 38.

The reference signal generation circuit 36 outputs, to the comparator 35, a reference signal Vr whose signal level changes at a constant rate with time. The comparator 35 on each column compares the signal level of signal Vamp from the amplifier 33 on the corresponding column with the signal level of the reference signal Vr and outputs the signal Vcmp indicating a comparison result to the memory 42 and the signal select unit 48. The counter 46 outputs a count signal indicating a count value that is a counting value of the clock signal to the memory 42 on each column.

The signal select unit 48 generates the long/short select signal JJ based on the latch signal Vcmp received from the comparator 35 and the saturation decision signal JL held in the JL-memory 44-1 and outputs the generated long/short select signal JJ to the memory 42. The memory 42 holds the long/short select signal JJ generated by the signal select unit 48 in the JJ-memory 44-6.

The memory 42 on each column holds, as a digital signal obtained by performing AD conversion on the signal Vcmp, a count signal received from the counter 46 when the signal level of the signal Vcmp changes. The memory 42 holds a digital signal obtained after AD conversion in the N-memory 44-2 or the S-memory 44-3 in accordance with the type of the signal.

The horizontal scanning circuit 50 reads out the long/short select signal JJ and the digital signals N and S held in the memory 42 on each column sequentially on a column basis and transfers the read out signal to the signal processing unit 60. The signal processing unit 60 performs a calculation process on the long/short select signal JJ and the digital signals N and S sequentially read out from the memory 42 and outputs the digital signal D.

Figure 17:
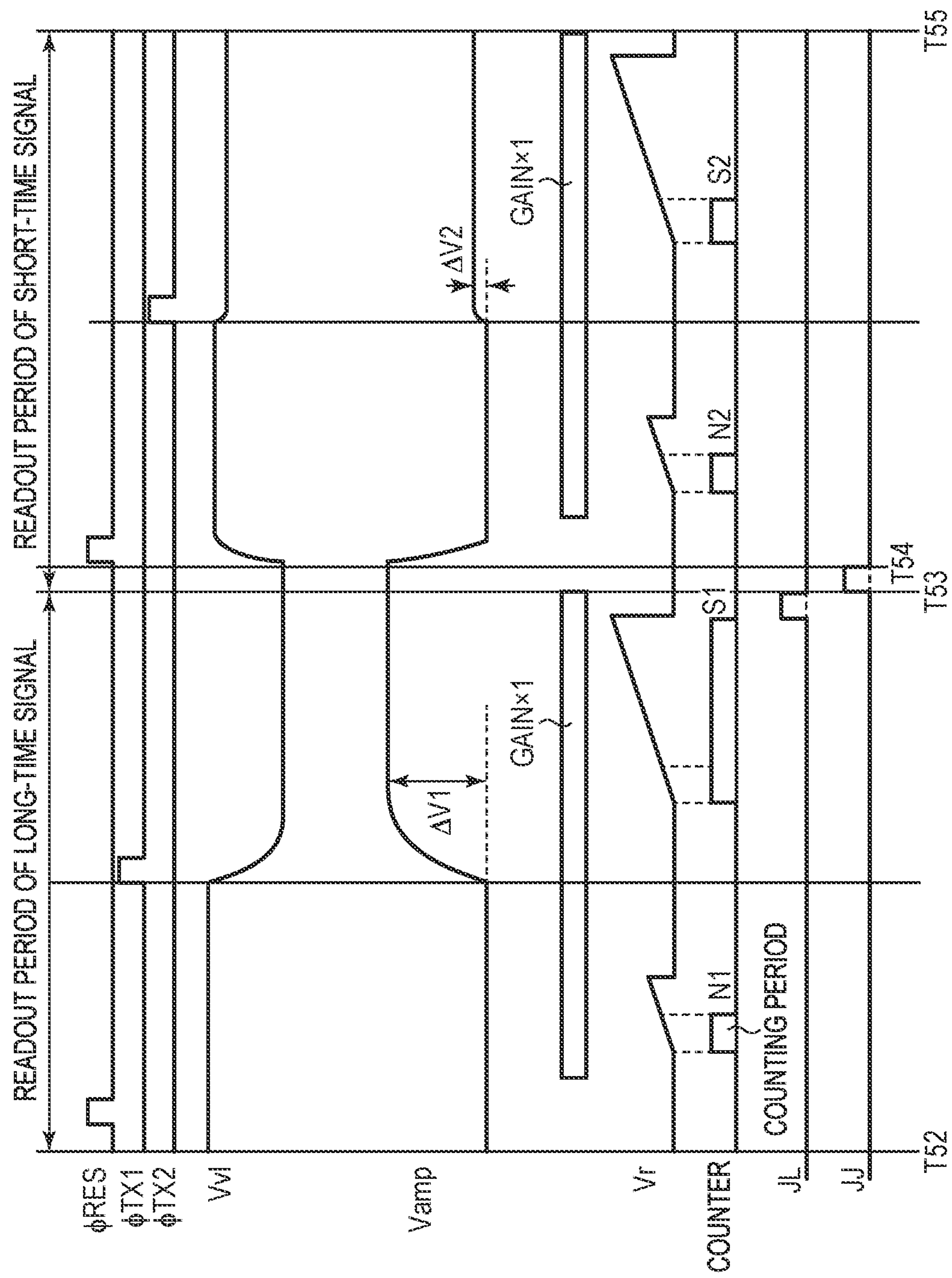
FIG. 17 is a timing diagram illustrating a readout operation on one row of the imaging element in the imaging device according to the fourth embodiment of the present invention.

Next, a readout operation for one row in the imaging element 100 will be described by using FIG. 17. FIG. 17 is a timing diagram illustrating a readout operation for one row of the imaging element in the imaging device according to the present embodiment.

First, an operation from time T52 to time T53, which is a readout period for a long-time signal of the pixel 12 on the first row, will be described.

In the initial state where the pixel 12 on the first row is selected, the control signal ϕRES is temporarily controlled to the H level by the vertical scanning circuit 20, and the voltage of the floating diffusion FD of the pixel 12 is reset. Thereby, a signal (N1-signal) in accordance with the reset voltage of the floating diffusion FD is output to the vertical signal line 16 as the signal Vvl.

Further, in parallel to a reset operation of the floating diffusion FD, the reset signal of the amplifier 33 is temporarily controlled to the H level, and the output of the amplifier 33 (signal Vamp) is reset. After the control signal ϕRES is controlled to the L level by the vertical scanning circuit 20 and the reset operation of the floating diffusion FD of the pixel 12 ends, the reset signal of the amplifier 33 is controlled to the L level and the reset operation of the amplifier 33 ends. Thereby, the N1-signal amplified at a predetermined gain (one-fold in this example) set in the amplifier 33 is output from the amplifier 33 as the signal Vamp.

Next, the AD conversion process (N1 conversion) is performed on the signal Vamp output from the amplifier 33. The reference signal generation circuit 36 starts changing the reference signal Vr at a constant rate. Further, the counter 46 starts counting in synchronization with the start of a change in the reference signal Vr and outputs a count signal indicating a count value to the memory 42 on each column.

The comparator 35 compares the signal level of the signal Vamp with the signal level of the reference signal Vr and outputs a latch signal Vcmp to the memory 42 at a timing when the compared signal levels become the same. The memory 42 latches the count value received from the counter 46 at a timing of receiving the latch signal Vcmp from the comparator 35 and holds the value in the N-memory 44-2. The count value held in the N-memory 44-2 corresponds to the digital N1-signal obtained by performing AD conversion on the N1-signal.

Next, the control signal ϕTX1 is temporarily controlled to the H level by the vertical scanning circuit 20, and charges held in the charge holding portion MEM1 are transferred to the floating diffusion FD. Thereby, a signal (S1-signal) in accordance with the amount of charges transferred to the floating diffusion FD is output to the vertical signal line 16 as the signal Vvl. The S1-signal amplified at a predetermined gain (one-fold in this example) set in the amplifier 33 is then output from the amplifier 33 as the signal Vamp. Thereby, the output voltage of the signal Vamp increases by the voltage ΔV1 corresponding to the S1-signal.

Next, the AD conversion process (S1 conversion) is performed on the signal Vamp output from the amplifier 33. The reference signal generation circuit 36 starts changing the reference signal Vr at a constant rate. Further, the counter 46 starts counting in synchronization with the start of a change in the reference signal Vr and outputs a count value to the memory 42 on each column.

The comparator 35 compares the signal level of the signal Vamp with the signal level of the reference signal Vr and outputs a latch signal Vcmp to the memory 42 at a timing when the compared signal levels become the same. The memory 42 latches the count value received from the counter 46 at a timing of receiving the latch signal Vcmp from the comparator 35 and holds the value in the S-memory 44-3. The count value held in the S-memory 44-3 corresponds to the digital S1-signal obtained by performing AD conversion on the S1-signal.

On the other hand, when the signal level of the signal Vamp is greater than or equal to a preset saturation level and Vamp is always greater than Vr during the S1 conversion period, the long-time signal saturation decision unit 38 outputs the saturation decision signal JL having the H level at the end of the S1 conversion period to the JL-memory 44-1.

Next, in the period from time T53 to time T54, the long/short select signal JJ used as a criterion for whether a long-time signal is held or a short-time signal is held in the N-memory 44-2 and the S-memory 44-3 is generated. The signal select unit 48 generates the long/short select signal JJ based on the saturation decision signal JL and holds the generated long/short select signal JJ in the JJ-memory 44-6 of the memory 42. For example, in a case of a monochrome sensor, the signal select unit 48 generates a long/short select signal JJ(N) corresponding to the pixel 12 on the N-th column based on the saturation decision signals JL(N−1), JL(N), and JL(N+1) and holds the generated long/short select signal JJ(N) in the JJ-memory 44-6 on the N-th column. If the saturation decision signal JL(N) is 1, a long/short select signal JJ(N) of 1 is output unconditionally. Even if the saturation decision signal JL(N) is 0, if one of the saturation decision signal JL(N−1) and the saturation decision signal JL(N+1) is 1, a long/short select signal JJ(N) of 1 is output. Only if all the saturation decision signals JL(N−1), JL(N), and JL(N+1) are 0, the long/short select signal JJ(N) of 0 is output.

For example, when holding a short-time signal in the N-memory 44-2 and the S-memory 44-3, the signal select unit 48 outputs the long/short select signal JJ(N) of the H level. When holding a long-time signal in the N-memory 44-2 and the S-memory 44-3, the signal select unit 48 outputs the long/short select signal JJ(N) of the L level.

Next, an operation from time T54 to time T55, which is a readout period for a short-time signal of the pixel 12 on the first row, will be described.

The state where the pixel 12 on the first row is selected continues from the readout period of a long-time signal. In this state, the control signal ϕRES is temporarily controlled to the H level by the vertical scanning circuit 20, and the voltage of the floating diffusion FD of the pixel 12 is reset. Thereby, a signal (N2-signal) in accordance with the reset voltage of the floating diffusion FD is output to the vertical signal line 16 as the signal Vvl.

Further, in parallel to a reset operation of the floating diffusion FD, the reset signal of the amplifier 33 is temporarily controlled to the H level, and the output of the amplifier 33 (signal Vamp) is reset. After the control signal ϕRES is controlled to the L level by the vertical scanning circuit 20 and the reset operation of the floating diffusion FD of the pixel 12 ends, the reset signal of the amplifier 33 is controlled to the L level and the reset operation of the amplifier 33 ends. Thereby, the N2-signal amplified at a predetermined gain (one-fold in this example) set in the amplifier 33 is output from the amplifier 33 as the signal Vamp.

Next, the AD conversion process (N2 conversion) is performed on the signal Vamp output from the amplifier 33. The reference signal generation circuit 36 starts changing the reference signal Vr at a constant rate. Further, the counter 46 starts counting in synchronization with the start of a change in the reference signal Vr and outputs a count signal indicating a count value to the memory 42 on each column.

The comparator 35 compares the signal level of the signal Vamp with the signal level of the reference signal Vr and outputs a latch signal Vcmp to the signal select unit 48 at a timing when the compared signal levels become the same. The signal select unit 48 generates a write signal Vcmp2 in accordance with the latch signal Vcmp and the long/short select signal JJ held in the JJ-memory 44-6 and outputs the generated write signal Vcmp2 to the memory 42. The memory 42 latches the count value received from the counter 46 at a timing of receiving the write signal Vcmp2 of the H level from the signal select unit 48 and holds the value in the N-memory 44-2.

Specifically, the signal select unit 48 outputs the write signal Vcmp2 of the H level if both the latch signal Vcmp and the long/short select signal JJ are at the H level. That is, if the long/short select signal JJ is at the H level, the memory 42 holds a count value (digital N2-signal) in accordance with the output timing of the latch signal Vcmp in the N-memory 44-2. On the other hand, if the long/short select signal JJ is at the L level, the digital N2-signal is not held in the N-memory 44-2.

Next, the control signal ϕTX2 is temporarily controlled to the H level by the vertical scanning circuit 20, and charges held in the charge holding portion MEM2 are transferred to the floating diffusion FD. Thereby, a signal (S2-signal) in accordance with the amount of charges transferred to the floating diffusion FD is output to the vertical signal line 16 as the signal Vvl. The S2-signal amplified at a predetermined gain (one-fold in this example) set in the amplifier 33 is then output from the amplifier 33 as the signal Vamp. Thereby, the output voltage of the signal Vamp increases by the voltage AV2 corresponding to the S2-signal.

Next, the AD conversion process (S2 conversion) is performed on the signal Vamp output from the amplifier 33. The reference signal generation circuit 36 starts changing the reference signal Vr at a constant rate. Further, the counter 46 starts counting in synchronization with the start of a change in the reference signal Vr and outputs a count signal indicating a count value to the memory 42 on each column.

The comparator 35 compares the signal level of the signal Vamp with the signal level of the reference signal Vr and outputs a latch signal Vcmp to the signal select unit 48 at a timing when the compared signal levels become the same. The signal select unit 48 generates a write signal Vcmp2 in accordance with the latch signal Vcmp and the long/short select signal JJ held in the JJ-memory 44-6 and outputs the generated write signal Vcmp2 to the memory 42. The memory 42 latches the count value received from the counter 46 at a timing of receiving the write signal Vcmp2 of the H level from the signal select unit 48 and holds the value in the S-memory 44-3.

Specifically, the signal select unit 48 outputs the write signal Vcmp2 of the H level if both the latch signal Vcmp and the long/short select signal JJ are at the H level. That is, if the long/short select signal JJ is at the H level, the memory 42 holds a count value (digital S2-signal) in accordance with the output timing of the latch signal Vcmp in the S-memory 44-3. On the other hand, if the long/short select signal JJ is at the L level, the digital S2-signal is not held in the S-memory 44-3.

As a result, if the long/short select signal JJ is at the H level, the digital N2-signal is held in the N-memory 44-2 as the digital N-signal, and the digital S2-signal is held in the S-memory 44-3 as the digital S-signal. Further, if the long/short select signal JJ is at the L level, the digital N1-signal is held in the N-memory 44-2 as the digital N-signal, and the digital S1-signal is held in the S-memory 44-3 as the digital S-signal.

The long/short select signal JJ, the digital N-signal, and the digital S-signal held in the memory 42 on each column are transferred to the signal processing unit 60 sequentially on a column basis in accordance with a control signal supplied from the horizontal scanning circuit 50. The signal processing unit 60 performs the same process as the HDR composition unit 260 in the third embodiment and outputs HDR compression data D.

Figure 18A:
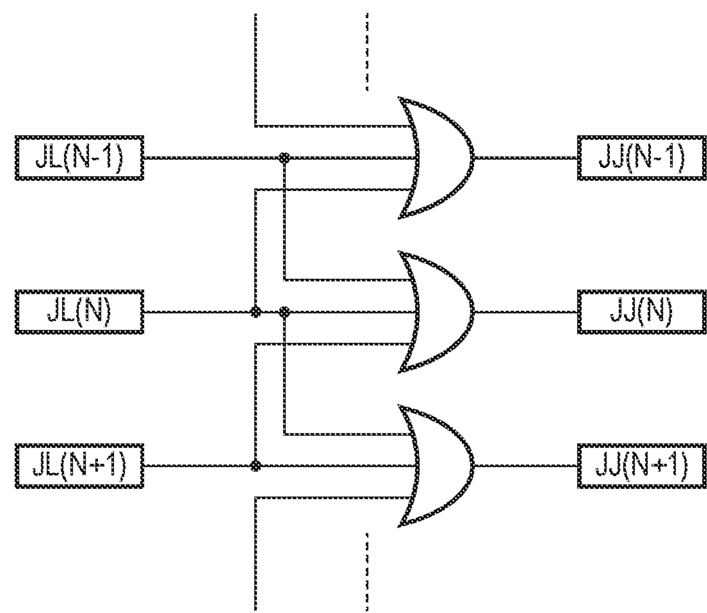
FIG. 18A and FIG. 18B are circuit diagrams illustrating configuration examples of the signal processing unit of the imaging element in the imaging device according to the fourth embodiment of the present invention.
Figure 18B:
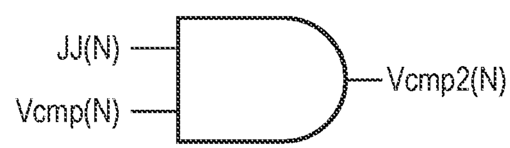

Next, a configuration example of the signal select unit 48 will be described by using FIG. 18A and FIG. 18B. FIG. 18A and FIG. 18B are circuit diagrams illustrating a configuration example of the signal select unit 48. FIG. 18A is a generation circuit of the long/short select signal JJ, and FIG. 18B is a generation circuit of the write signal Vcmp2.

The signal select unit 48 includes a generation circuit of the long/short select signal JJ and a generation circuit of the write signal Vcmp2. For example, as illustrated in FIG. 18A, the generation circuit of the long/short select signal JJ is formed of a plurality of OR circuits, each of which calculates a logical product of the saturation decision signals JL for every adjacent three columns. For example, the logical product of the saturation decision signals JL(N−1), JL(N), and JL(N+1) corresponds to the long/short select signal JJ(N) on the N-th column. For example, as illustrated in FIG. 18B, the generation circuit of the write signal Vcmp2 is formed of an AND circuit that calculates a logical sum of the long/short select signal JJ and the latch signal Vcmp. For example, the logical product of the long/short select signal JJ(N) and the latch signal Vcmp(N) corresponds to the write signal Vcmp2(N) on the N-th column.

Also in the imaging device according to the present embodiment, as with the first embodiment, even with a signal of the pixel in which the long-time signal is not saturated, when the long-time signal of the adjacent pixels is saturated, a pixel value is calculated by using the value of the short-time signal. Therefore, an HDR composition signal having small spatial variation can be obtained also by the imaging device of the present embodiment. Furthermore, since saturation decision operations and signal select operations are performed in parallel with respect to columns inside the imaging element in the present embodiment, a faster decision process is possible. Further, since it is not necessary to provide column memories in association with each of the long-time signal and a short-time signal, the area of a peripheral circuit of the imaging element can be reduced. Further, since a signal select operation is performed inside the imaging device, a band of data transmitted to the outside of the imaging device can also be reduced.

As described above, according to the present embodiment, when composing a high dynamic range image by using a long-time image and a short-time image, image quality at a joining part between the long-time image and the short-time image can be improved.

Fifth Embodiment

Figure 19:
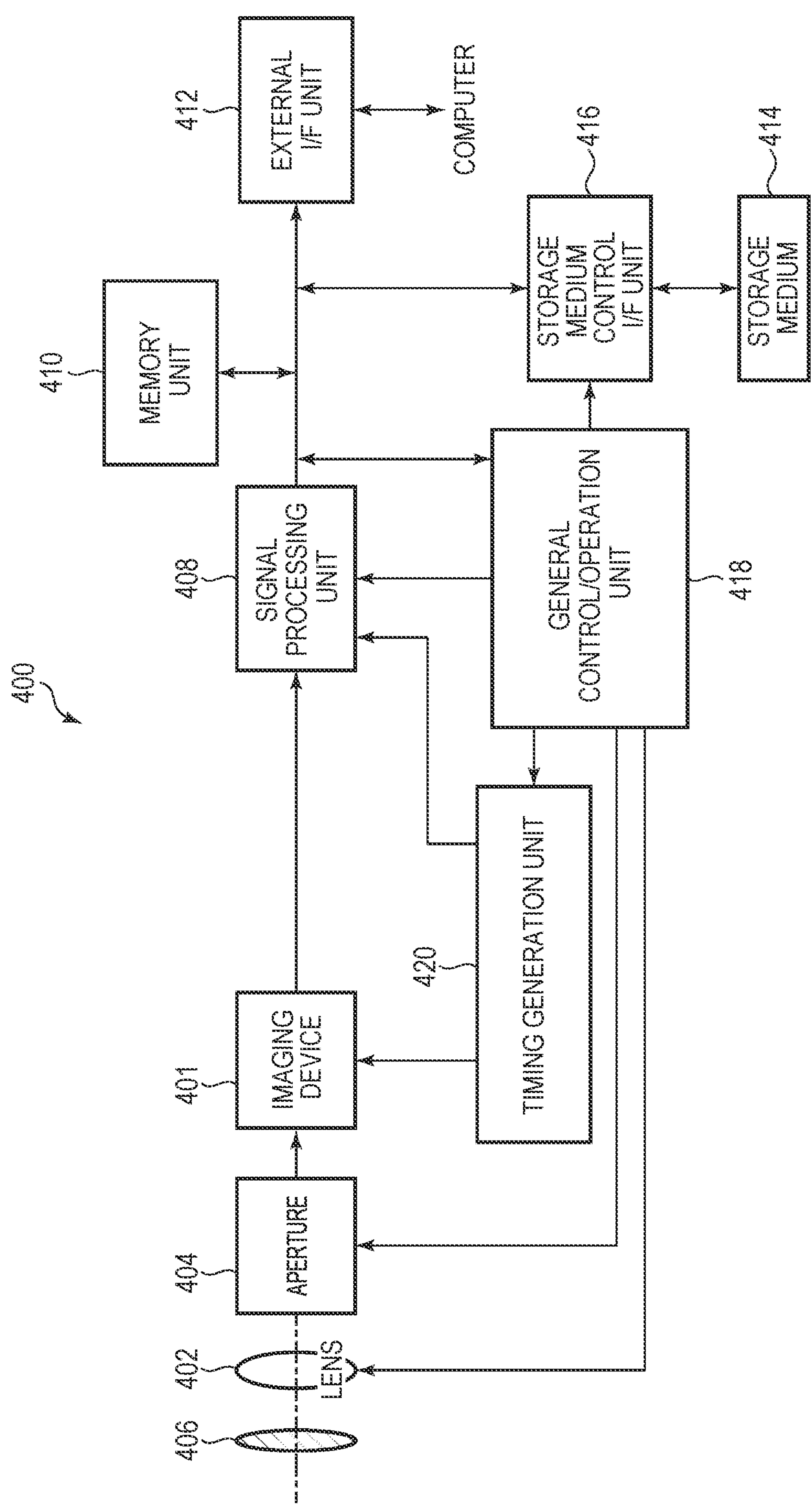
FIG. 19 is a block diagram illustrating a general configuration of an imaging system according to a fifth embodiment of the present invention.

An imaging system according to a fifth embodiment of the present invention will be described with reference to FIG. 19. FIG. 19 is a block diagram illustrating a general configuration of the imaging system according to the present embodiment.

The imaging device 300 described in the first to fourth embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 19 illustrates a block diagram of a digital still camera as an example out of these examples.

An imaging system 400 illustrated as an example in FIG. 19 includes an imaging device 401, a lens 402 that captures an optical image of an object onto the imaging device 401, an aperture 404 for changing a light amount passing through the lens 402, and a barrier 406 for protecting the lens 402. The lens 402 and the aperture 404 form an optical system that converges a light onto the imaging device 401. The imaging device 401 is the imaging device 300 described in any of the first to fourth embodiments and converts an optical image captured by the lens 402 into image data.

Further, the imaging system 400 includes a signal processing unit 408 that processes an output signal output from the imaging device 401. The signal processing unit 408 preforms an operation of signal processing to perform various correction or compression on an input signal, if necessary, and output the processed signal. For example, the signal processing unit 408 performs predetermined image processing such as a conversion process to convert RGB pixel output signals into aY, Cb, Cr color space, gamma correction, or the like on the input signal. Further, the signal processing unit 408 may have a part or all of the function of the signal processing unit 200 in the imaging device 300 described in the first to fourth embodiments.

Furthermore, the imaging system 400 includes a memory unit 410 for temporarily storing image data therein and an external interface unit (external I/F unit) 412 for communicating with an external computer or the like. The imaging system 400 further includes a storage medium 414 such as a semiconductor memory for performing storage or readout of imaging data and a storage medium control interface unit (storage medium control I/F unit) 416 for performing storage or readout on the storage medium 414. Note that the storage medium 414 may be embedded in the imaging system 400 or may be removable.

Furthermore, the imaging system 400 includes a general control/operation unit 418 that performs various calculation and controls the entire digital still camera and a timing generation unit 420 that outputs various timing signals to the imaging device 401 and the signal processing unit 408. Here, the timing signal or the like may be input from the outside, and the imaging system 400 may include at least the imaging device 401 and the signal processing unit 408 that processes an output signal output from the imaging device 401. The general control/operation unit 418 and the timing generation unit 420 may be configured to implement a part or all of the control function of the imaging device 401.

The imaging device 401 outputs an imaging signal to the signal processing unit 408. The signal processing unit 408 performs predetermined signal processing on an imaging signal output from the imaging device 401 and outputs image data. The signal processing unit 408 uses an imaging signal to generate an image. The image generated by the signal processing unit 408 is stored in the storage medium 414, for example. Further, an image generated by the signal processing unit 408 is projected on a monitor formed of a liquid crystal display or the like as a moving image or a static image. An image stored in the storage medium 414 can be hard-copied by a printer or the like.

Note that the function provided by the signal processing unit 408 may be implemented by a signal processing device other than the imaging device 300. Further, the imaging device 300 may have the function provided by the signal processing unit 408.

As discussed above, according to the present embodiment, the imaging system to which the imaging device 300 according to the first to fourth embodiment is applied can be realized.

Sixth Embodiment

Figure 20A:
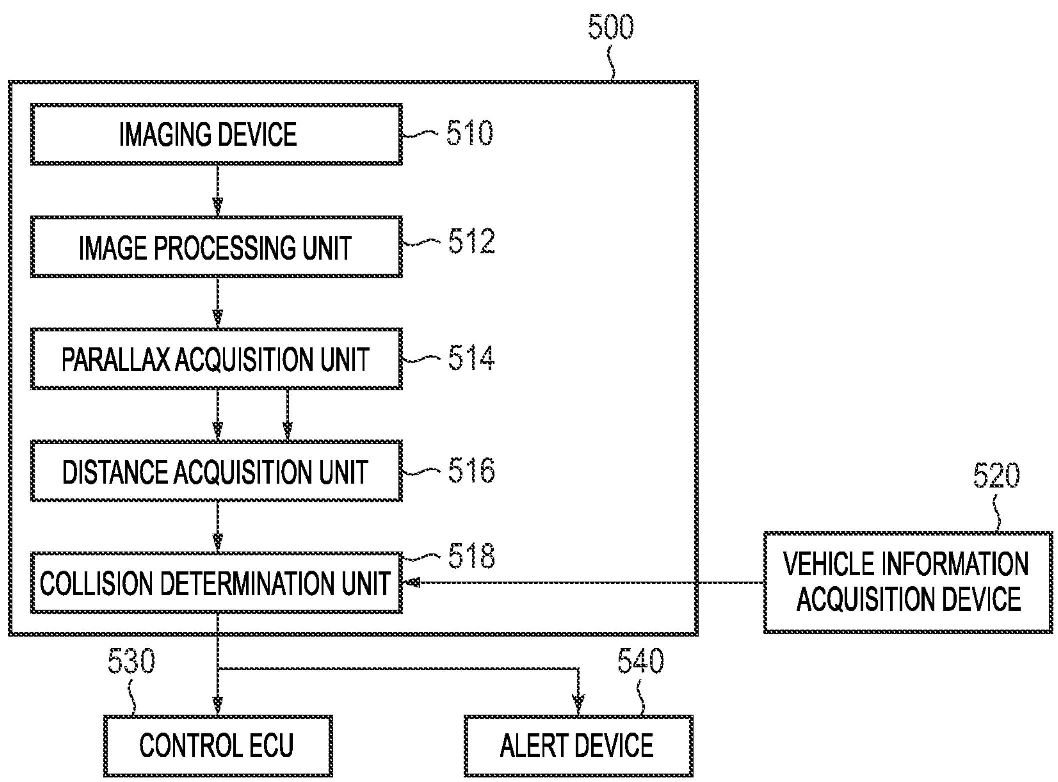
FIG. 20A is a diagram illustrating a configuration example of an imaging system according to a sixth embodiment of the present invention.
Figure 20B:
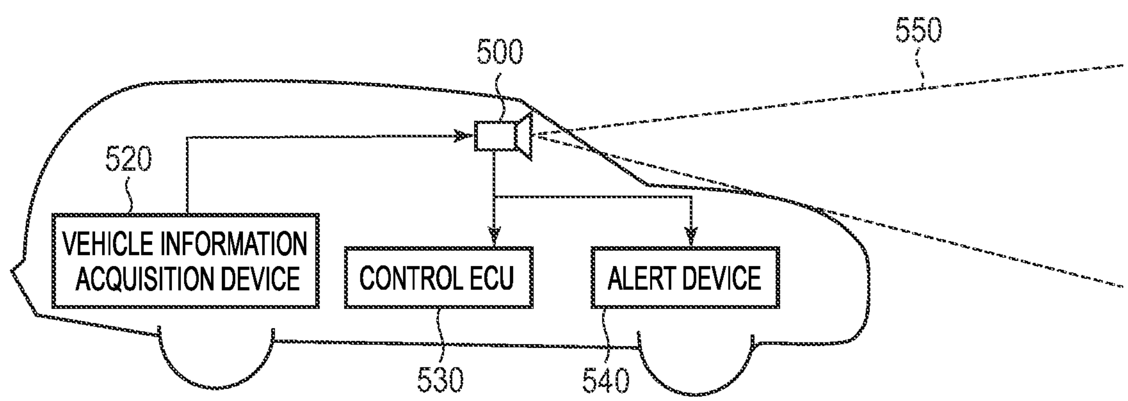
FIG. 20B is a diagram illustrating a configuration example of a movable object according to the sixth embodiment of the present invention.

An imaging system and a movable object according to a sixth embodiment of the present invention will be described with reference to FIG. 20A and FIG. 20B. FIG. 20A is a schematic diagram illustrating a configuration example of the imaging system according to the present embodiment. FIG. 20B is a schematic diagram illustrating a configuration example of the movable object according to the present embodiment.

FIG. 20A illustrates an example of an imaging system related to an on-vehicle camera. The imaging system 500 includes an imaging device 510. The imaging device 510 is the imaging device 300 described in any of the above first to fourth embodiments. The imaging system 500 includes an image processing unit 512 that performs image processing on a plurality of image data acquired by the imaging device 510 and a parallax acquisition unit 514 that calculates a parallax (a phase difference of parallax images) from the plurality of image data acquired by the imaging device 510. Further, the imaging system 500 includes a distance acquisition unit 516 that calculates a distance to the object based on the calculated parallax and a collision determination unit 518 that determines whether or not there is a collision possibility based on the calculated distance. Here, the parallax acquisition unit 514 and the distance acquisition unit 516 are an example of a distance information acquisition unit that acquires distance information on the distance to the object. That is, the distance information is information on a parallax, a defocus amount, a distance to an object, or the like. The collision determination unit 518 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 500 is connected to the vehicle information acquisition device 520 and can acquire vehicle information such as a vehicle speed, a yaw rate, a steering angle, or the like. Further, the imaging system 500 is connected to a control ECU 530, which is a control device that outputs a control signal for causing a vehicle to generate braking force based on a determination result by the collision determination unit 518. That is, the control ECU 530 is an example of a movable object control unit that controls a movable object based on distance information. Further, the imaging system 500 is also connected to an alert device 540 that issues an alert to the driver based on a determination result by the collision determination unit 518. For example, when the collision probability is high as the determination result of the collision determination unit 518, the control ECU 530 performs vehicle control to avoid a collision or reduce damage by applying a brake, pushing back an accelerator, suppressing engine power, or the like. The alert device 540 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 500. FIG. 20B illustrates the imaging system 500 when a front area of a vehicle (a capturing area 550) is captured. The vehicle information acquisition device 520 transmits an instruction to cause the imaging system 500 to operate and perform capturing. Such a configuration can further improve the ranging accuracy. With the use of the imaging device of the first to fourth embodiments as the imaging device 510, the imaging system 500 of the present embodiment can further improve ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

MODIFIED EMBODIMENTS

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, the imaging systems illustrated in the above fifth and sixth embodiments are examples of an imaging system to which the imaging device of the present invention may be applied, and an imaging system to which the imaging device of the present invention can be applied is not limited to the configuration illustrated in FIG. 19 and FIG. 20A.

The present invention may be realized also by a process in which a program that implements one or more functions of the embodiments described above is supplied to a system or a device via a network or a storage medium and then one or more processors in a computer of the system or the device read out and execute the program. Further, the present invention may be realized by a circuit (for example, ASIC) that implements one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-201644, filed Oct. 26, 2018 which is hereby incorporated by reference herein in its entirety.

What is claimed is:

1. An imaging device comprising:

a plurality of pixels arranged over a plurality of rows and a plurality of columns and each having a photoelectric converter;

a control unit that controls the plurality of pixels so as to output, from each of the plurality of pixels, a first signal based on charges generated by the photoelectric converter during a first exposure time and a second signal based on charges generated by the photoelectric converter during a second exposure time that is shorter than the first exposure time;

a decision unit that performs a decision process to decide whether or not a predetermined value is exceeded for the first signal output from each of the plurality of pixels and outputs a decision signal indicating a decision result; and a signal select unit that selects one of the first signal and the second signal as an image forming signal of each of the plurality of pixels, wherein based on the decision signal of a target pixel and the decision signal of another pixel arranged in a predetermined region including the target pixel, the signal select unit selects the image forming signal of the target pixel.

2. The imaging device according to claim 1, wherein the predetermined region includes a plurality of columns adjacent to each other.

3. The imaging device according to claim 1, wherein the predetermined region includes a plurality of rows adjacent to each other.

4. The imaging device according to claim 1, wherein the another pixel is a pixel adjacent to the target pixel.

5. The imaging device according to claim 1, wherein the another pixel is a pixel comprising a color filter of the same color as the target pixel.

6. The imaging device according to claim 1, wherein the signal select unit selects the first signal as the image forming signal of the target pixel when the decision signal of the target pixel and the decision signal of the another pixel indicate that the first signal does not exceed the predetermined value, and selects the second signal as the image forming signal of the target pixel when the decision signal of the another pixel indicates that the first signal exceeds the predetermined value.

7. The imaging device according to claim 1, wherein the predetermined value is a saturation threshold value of the first signal.

8. The imaging device according to claim 1 further comprising a plurality of memories provided in association with the plurality of columns, respectively, wherein each of the plurality of memories holds the first signal and the second signal output from the pixels arranged on a corresponding column.

9. The imaging device according to claim 1 further comprising a plurality of memories provided in association with the plurality of columns, respectively, wherein each of the plurality of memories holds a signal selected as the image forming signal by the signal select unit from the first signal and the second signal output from the pixels arranged on a corresponding column.

10. The imaging device according to claim 9, wherein the signal select unit performs, in parallel with respect to columns, a signal select process on signals output from the pixels on each column.

11. The imaging device according to claim 1, wherein the decision unit performs, in parallel with respect to columns, the decision process on the first signal output from the pixels on each column.

12. The imaging device according to claim 1 further comprising a composition unit that composes a high dynamic range image by using the first signal and the second signal selected as the image forming signal of the plurality of pixels.

13. A movable object comprising:

the imaging device according to claim 1;

a distance information acquisition unit that acquires distance information on a distance to an object, from a parallax image based on signals output from the pixels of the imaging device; and a movable object control unit that controls the movable object based on the distance information.

14. A signal processing device configured to process a signal output from an imaging element that includes a plurality of pixels each having a photoelectric converter and outputs, from each of the plurality of pixels, a first signal based on charges generated by the photoelectric converter during a first exposure time and a second signal based on charges generated by the photoelectric converter during a second exposure time that is shorter than the first exposure time, the signal processing device comprising:

a decision unit that decides whether or not a predetermined value is exceeded for the first signal output from each of the plurality of pixels and outputs a decision signal indicating a decision result; and a signal select unit that selects one of the first signal and the second signal as an image forming signal of each of the plurality of pixels, wherein based on the decision signal of a target pixel and the decision signal of another pixel arranged in a predetermined region including the target pixel, the signal select unit selects the image forming signal of the target pixel.

15. An imaging system comprising:

an imaging device comprising an imaging element that includes a plurality of pixels each having a photoelectric converter and output, from each of the plurality of pixels, a first signal based on charges generated by the photoelectric converter during a first exposure time and a second signal based on charges generated by the photoelectric converter during a second exposure time that is shorter than the first exposure time; and a signal processing unit that processes a signal output from the imaging device, wherein the signal processing unit comprises a decision unit that decides whether or not a predetermined value is exceeded for the first signal output from each of the plurality of pixels and outputs a decision signal indicating a decision result, and a signal select unit that selects one of the first signal and the second signal as an image forming signal of each of the plurality of pixels, wherein based on the decision signal of a target pixel and the decision signal of another pixel arranged in a predetermined region including the target pixel, the signal select unit selects the image forming signal of the target pixel.

* * * * *